(12) United States Patent
Mischitz et al.

(10) Patent No.: US 9,929,111 B2
(45) Date of Patent: Mar. 27, 2018

(54) METHOD OF MANUFACTURING A LAYER STRUCTURE HAVING PARTIALLY SEALED PORES

(71) Applicant: Infineon Technologies AG, Neubiberg (DE)

(72) Inventors: Martin Mischitz, Wernberg (AT); Markus Heinrici, Villach (AT); Barbara Eichinger, Vienna (AT); Manfred Schneegans, Vaterstaetten (DE); Stefan Krivec, Arnoldstein (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/461,500

(22) Filed: Mar. 17, 2017

(65) Prior Publication Data

US 2017/0194272 A1 Jul. 6, 2017

Related U.S. Application Data

(62) Division of application No. 14/953,456, filed on Nov. 30, 2015, now Pat. No. 9,620,466.

(51) Int. Cl.

| | |
|---|---|
| *H01L 21/00* | (2006.01) |
| *H01L 23/00* | (2006.01) |
| *H01L 21/02* | (2006.01) |
| *H01L 23/532* | (2006.01) |
| *H01L 21/762* | (2006.01) |

(52) U.S. Cl.
CPC ........ *H01L 24/03* (2013.01); *H01L 21/02203* (2013.01); *H01L 21/02513* (2013.01); *H01L 21/76259* (2013.01); *H01L 23/53238* (2013.01); *H01L 2224/0331* (2013.01); *H01L 2224/0345* (2013.01); *H01L 2224/0384* (2013.01); *H01L 2224/03505* (2013.01); *H01L 2224/03602* (2013.01); *H01L 2224/03616* (2013.01); *H01L 2224/05541* (2013.01); *H01L 2224/05551* (2013.01); *H01L 2924/3511* (2013.01); *H01L 2924/35121* (2013.01)

(58) Field of Classification Search
CPC ......... H01L 21/02203; H01L 21/76259; H01L 21/02513
See application file for complete search history.

(56) References Cited

U.S. PATENT DOCUMENTS

| | | | | |
|---|---|---|---|---|
| 2006/0194075 A1* | 8/2006 | Miyamoto | ........... | H01G 9/2031 428/690 |
| 2015/0200333 A1* | 7/2015 | Okumoto | .............. | H01L 51/003 257/79 |
| 2015/0311066 A1* | 10/2015 | Bruce | ............... | H01L 21/02315 438/694 |

(Continued)

*Primary Examiner* — Ngan Ngo
(74) *Attorney, Agent, or Firm* — Viering, Jentschura & PartnermbB

(57) ABSTRACT

A method of manufacturing a layer structure includes: forming a first layer over a substrate; planarizing the first layer to form a planarized surface of the first layer; and forming a second layer over the planarized surface; wherein a porosity of the first layer is greater than a porosity of the substrate and greater than a porosity of the second layer; wherein the second layer is formed by physical vapor deposition; and wherein the first layer and the second layer are formed from the same solid material.

20 Claims, 14 Drawing Sheets

(56) References Cited

U.S. PATENT DOCUMENTS

2016/0013434 A1* 1/2016 Snaith ................. H01L 51/4226
                                                      136/252
2017/0022595 A1* 1/2017 Sato ......................... C23C 4/18
2017/0226640 A1* 8/2017 Mikijelj ................. C23C 16/50
2017/0250057 A1* 8/2017 Simpson ................ B32B 18/00

* cited by examiner

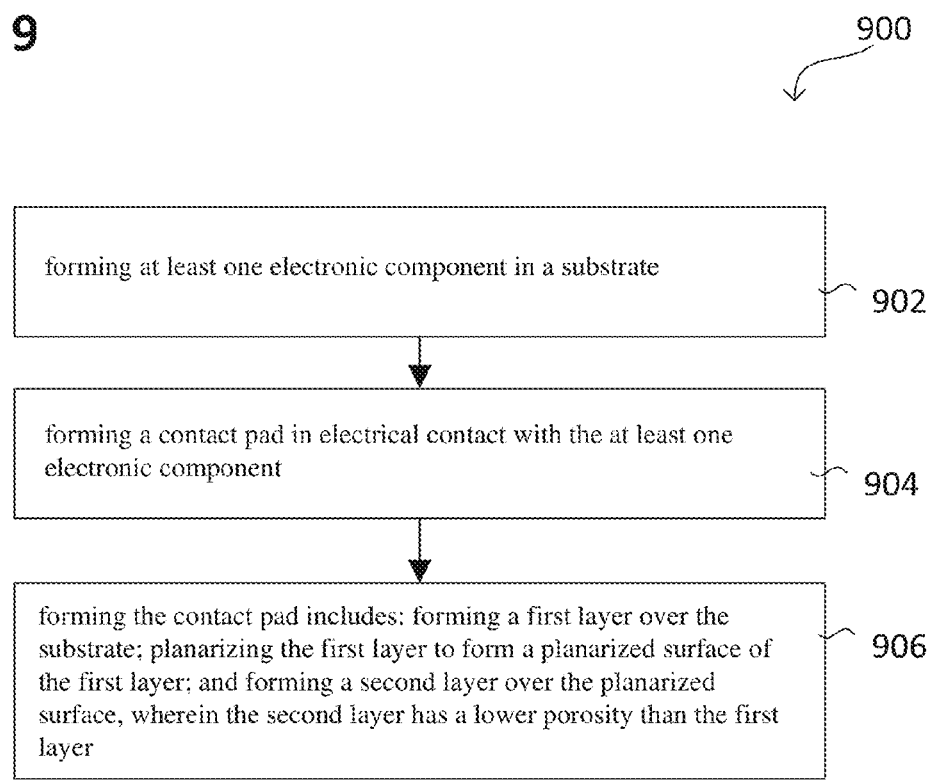

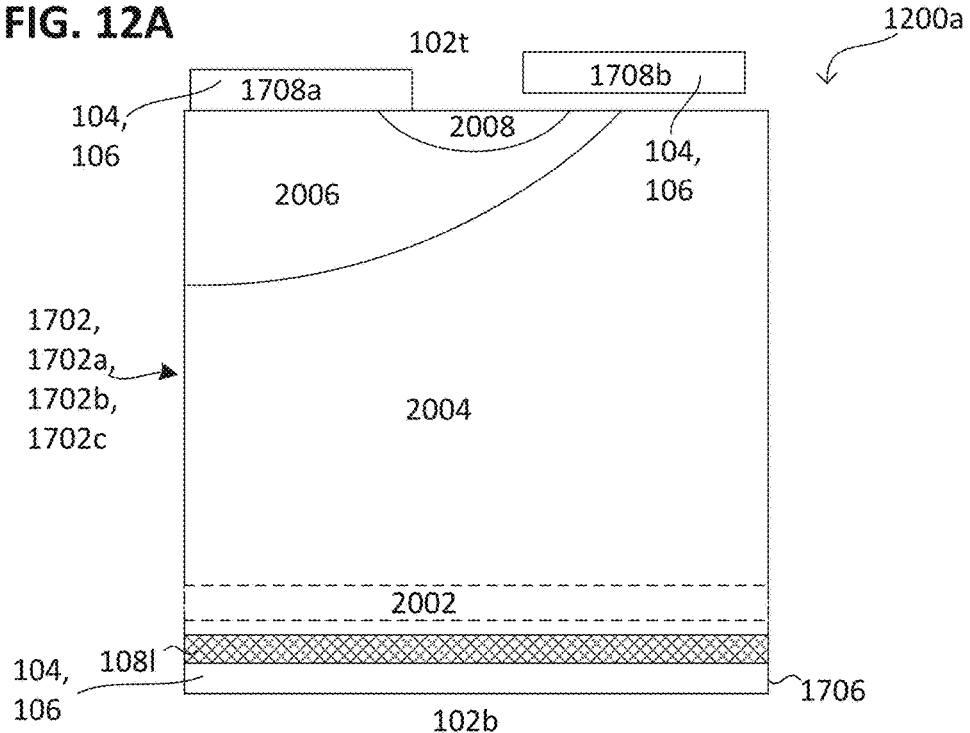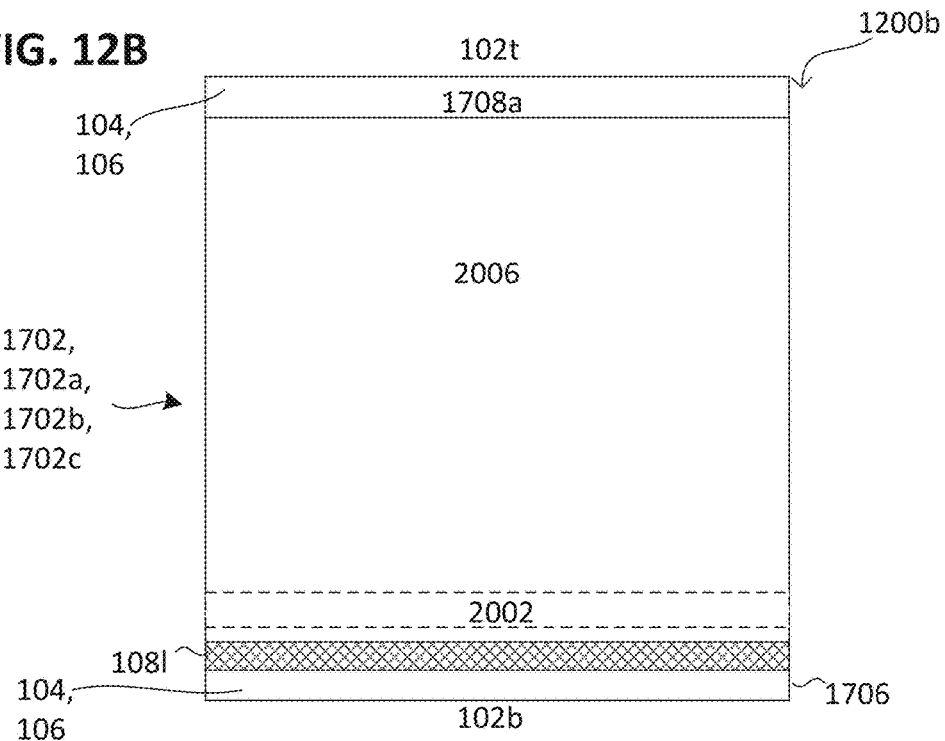

METHOD OF MANUFACTURING A LAYER STRUCTURE HAVING PARTIALLY SEALED PORES

CROSS-REFERENCE TO RELATED APPLICATIONS

This application is related to U.S. patent application Ser. No. 14/953,456, entitled "A METHOD OF MANUFACTURING AN ELECTRONIC DEVICE HAVING A CONTACT PAD WITH PARTIALLY SEALED PORES" filed Nov. 30, 2015, which is incorporated herein by reference.

TECHNICAL FIELD

Various embodiments relate generally to a device and a method processing a substrate.

BACKGROUND

In general, semiconductor materials may be processed in semiconductor technology on or in a substrate (also referred to as a wafer or a carrier), e.g. to fabricate integrated circuits (also referred to as chips). During processing of the semiconductor material, certain processes may be applied, such as forming one or more layers over the substrate, structuring the one or more layers, or contacting the chips. In general, a porous copper layer offers beneficial mechanical properties, for example, in the field of a thick power metallization.

In contrast to a dense layer (bulk copper) a porous copper layer may apply less mechanical and/or thermal stress to the silicon and, therefore, offer the possibility to prepare a thick copper layer on wafer and a chip, without inducing bowing of the wafer or the chip, delaminating from the wafer or the chip, and/or inducing cracks into the wafer or the chip.

Conventionally, the properties of a porous copper layer are adjusted by changing the preparation parameters, e.g. the source material (particle size or additives) or the processing parameters (deposition parameter, furnace parameter, annealing parameter). This adjustment is strongly limited to the range of the preparation parameters and, therefore, is rather narrow. Further, this adjustment fails in sealing the pores, requires additional effort, and is highly sensitive to the used copper particle containing paste, which reduces the scope of adapting the adjustment to other paste compositions.

Alternatively, two layers may be formed by printing different copper particle containing pastes or a metal-precursor paste over each other. This process may only be able to adjust the spatial porosity of the porous copper layer, fails in sealing the pores, requires additional effort, and is sensitive to the combination of the used copper particle containing paste.

Alternatively, the porous copper layer may be coated by electrochemical deposition or electro-less-chemical of a metal. This may result in the inclusion of the used electrolytes, increasing a risk of impurities and contamination or other consequences as a reduced reliability or damage to the device.

SUMMARY

A method of manufacturing a layer structure includes: forming a first layer over a substrate; planarizing the first layer to form a planarized surface of the first layer; and forming a second layer over the planarized surface; wherein a porosity of the first layer is greater than a porosity of the substrate and greater than a porosity of the second layer; wherein the second layer is formed by physical vapor deposition; and wherein the first layer and the second layer are formed from the same solid material.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 9 shows a method according to various embodiments in schematic flow diagram;

FIGS. 12A and 12B respectively show a device according to various embodiments in a processing stage of a method according to various embodiments in a schematic cross sectional view or side view;

DESCRIPTION

Figure 1A:
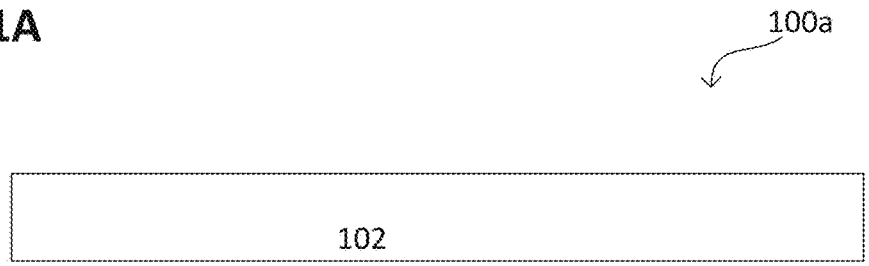
FIGS. 1A to 1D respectively show a device according to various embodiments in a method according to various embodiments in a schematic cross sectional view or side view.
Figure 1B:
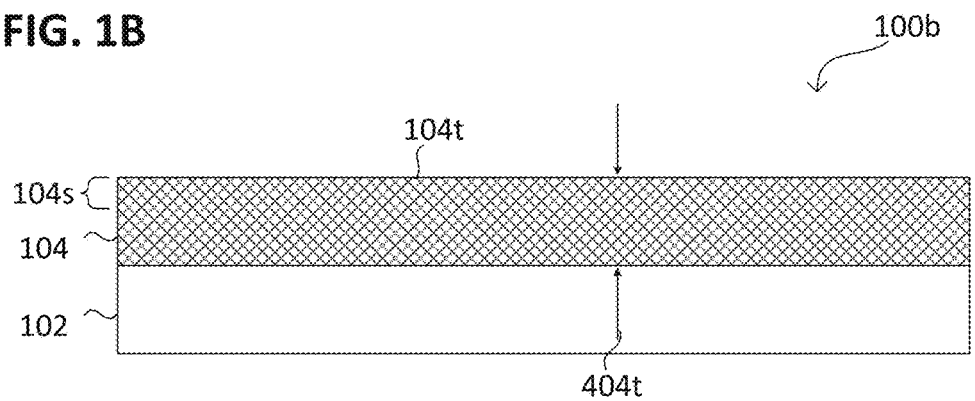
Figure 1C:
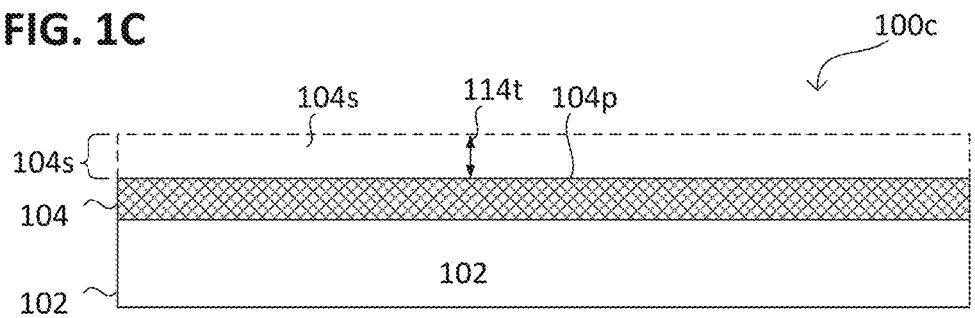
Figure 1D:
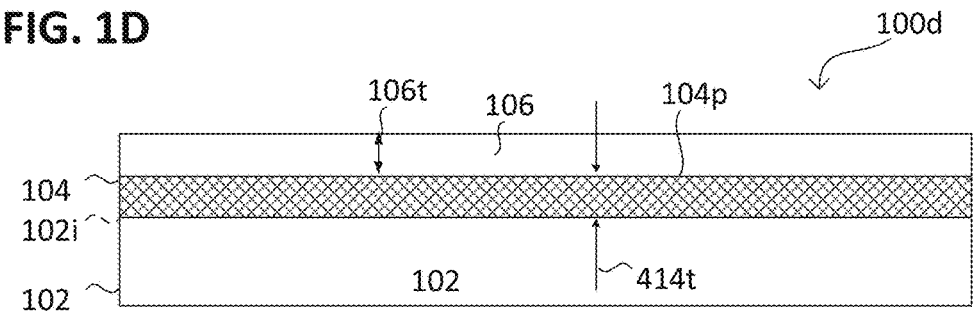

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The term "lateral" used with regards to the "lateral" extension of a structure (or of a substrate, a wafer, or a carrier) or "laterally" next to, may be used herein to mean an extension or a positional relationship along a surface of a substrate, a wafer, or a carrier. That means that a surface of a substrate (e.g. a surface of a carrier, or a surface of a wafer) may serve as reference, commonly referred to as the main processing surface of the substrate (or the main processing surface of the carrier or wafer). Further, the term "width" used with regards to a "width" of a structure (or of a structure element) may be used herein to mean the lateral extension of a structure. Further, the term "height" used with regards to a height of a structure (or of a structure element), may be used herein to mean an extension of a structure along a direction perpendicular to the surface of a substrate (e.g. perpendicular to the main processing surface of a substrate). The term "thickness" used with regards to a "thickness" of a layer may be used herein to mean the spatial extension of the layer perpendicular to the surface of the support (the material) on which the layer is deposited. If the surface of the support is parallel to the surface of the substrate (e.g. to the main processing surface) the "thickness" of the layer deposited on the support may be the same as the height of the layer. Further, a "vertical" structure may be referred to as a structure extending in a direction perpendicular to the lateral direction (e.g. perpendicular to the main processing surface of a substrate) and a "vertical" extension may be referred to as an extension along a direction perpendicular to the lateral direction (e.g. an extension perpendicular to the main processing surface of a substrate).

According to various embodiments, a substrate (also referred to as carrier or wafer) may include or be formed from semiconductor materials of various types, including a group IV semiconductor (e.g. silicon or germanium), a compound semiconductor, e.g. a group III-V compound semiconductor (e.g. gallium arsenide) or other types, including group III semiconductors, group V semiconductors or polymers, for example. In an embodiment, the substrate is made of silicon (doped or undoped), in an alternative embodiment, the substrate is a silicon on insulator (SOI) wafer. As an alternative, any other suitable semiconductor material can be used for the substrate, for example semiconductor compound material such as gallium phosphide (GaP), indium phosphide (InP), but also any suitable ternary semiconductor compound material or quaternary semiconductor compound material such as indium gallium arsenide (InGaAs).

The substrate may be processed to form one or more semiconductor chips at least one of in and over the substrate. A semiconductor chip may include an active chip area. The active chip area may be disposed in a portion of the substrate and may include one or more semiconductor circuit elements (also referred to as electronic components) like a transistor, a resistor, a capacitor, a diode or the like. The one or more semiconductor circuit elements may be configured to perform computing or storage operations. Alternatively or additionally, the one or more semiconductor circuit elements may be configured to perform switching or rectifying operations, e.g. in power electronics.

A semiconductor chip may be singulated from the substrate by removing material from a kerf region of the substrate (also called dicing or cutting the semiconductor region). For example, removing material from the kerf region of the substrate may be processed by scribing and breaking, cleavage, blade dicing or mechanical sawing (e.g. using a dicing saw). After singulating the semiconductor chip, it may be electrically contacted and encapsulated, e.g. by mold materials, into a chip carrier (also called a chip housing) which may then be suitable for use in electronic devices. For example, the semiconductor chip may be bonded to a chip carrier by wires, and the chip carrier may be soldered onto a printed circuit board.

According to various embodiments, a metal may include or may be formed from one element of the following group of elements (in other words, a metal may include or may be formed from at least one of): aluminum (Al), copper (Cu), nickel (Ni), magnesium (Mg), chromium (Cr), iron (Fe), zinc (Zn), tin (Sn), gold (Au), silver (Ag), iridium (Ir), platinum (Pt), and titanium (Ti), palladium (Pd). Alternatively or additionally, a metal may include or be formed from, a metal alloy including one element or more than one element of the group of elements. For example a metal alloy may include an intermetallic compound, e.g. an intermetallic compound of gold and aluminum, an intermetallic compound of copper and aluminum, an intermetallic compound of copper and zinc (e.g. "brass") or an intermetallic compound of copper and tin (e.g. "bronze"). According to various embodiments, an electrically conductive material, e.g. a metal, may be electrically conducting, e.g. having an electrical conductivity larger than about $10^4$ S/m, e.g. larger than about $10^6$ S/m.

A layer arrangement may be provided including a first layer and a second layer. Forming the second layer may be different from forming the first layer. For example, the first layer may be printed and the second layer may be sputtered. At least one of the first layer and the second layer may include or be formed from an electrically conducting material, e.g. a metal.

Illustratively, the layer arrangement may provide to combine the material properties (e.g. physical, mechanical, and/or chemical properties) of the first layer and the second layer. Illustratively, the first layer may reduce stress transferred to the interface of the substrate (e.g. a chip). The second layer may provide the mechanical properties (e.g. hardness, electrical conductivity, corrosion resistance, bondability, etc.) for connecting to a package. For example, the first layer may serve as stress absorber. The second layer may serve as protection layer and/or contacting template. The material properties of the layer arrangement may be adjusted by changing a thickness of at least one of the second layer and the first layer, e.g. a ratio of the thicknesses of both layers. The protection layer may include or be formed from a metallic hart-coating.

According to various embodiments, it was realized, that due to the rough topography of an as-prepared porous layer (also referred to as first layer), is may be complicated to seal the pores of the porous layer or provide a planar filling of the pores. Illustratively, due to the rough topography an electrical field for depositing further material in the porous layer may be inhomogeneous, having maxima at the protruding sections of the rough topography, which increases the attraction of the (e.g. sputtered) material to the protruding sections. Therefore, a spike-like growth may dominate the growing process of the second layer.

The electric field may provide the generation of a plasma, e.g. for sputtering or plasma enhanced chemical vapor deposition. In other words, forming the second layer may include using a plasma.

The topography of the first layer may be planarized to reduce the roughness of the first layer. Illustratively, the planarized first layer may provide a homogenous electric field distribution leading to a spatially homogenous material distribution, e.g. if sputtering is used to form the second layer. The second layer may be formed from a gaseous material, e.g. by at least one of chemical vapor deposition (CVD) and physical vapor deposition (PVD, also referred to as evaporation), e.g. sputtering.

According to various embodiments, planarizing the first layer may include or be formed from at least one of the following: machining, mechanical polishing, electrochemical polishing, and chemical mechanical polishing.

According to various embodiments, a layer arrangement and a method of forming the layer arrangement may be provided. The method may include: providing a first layer; planarizing the first layer; and forming a second layer over the planarized first layer. Optionally, the first layer may be formed over a layer stack including at least one of a seed layer and a barrier layer. Optionally, the first layer may be formed by at least one of paste printing, plasma-dust deposition, electrochemical deposition, and a combination thereof.

A density of the second layer may be greater than a density of the first layer. Alternatively or additionally, the second layer may include or be formed from non-porous layer. Illustratively, the layer structure may provide a hybrid-layer, which combines the advantages of both, a porous layer and a non-porous layer. Optionally, the first layer may include or be formed from at least two sublayers which differ from each other in at least one of a pore characteristic, a chemical composition, and a thickness.

According to various embodiments, the usage of the method may be revealed by analyzing at least one of the layer structure and the layer-to-layer interface, e.g. by at least one of scanning electron microscopy (SEM), focused-ion-beam ablation, and focused-ion-beam-microscopy. Alternatively or additionally, at least one of the following may be analyzed: the grain boundaries at the layer interface (e.g. by electron backscatter diffraction), the presence of electrolyte (e.g. by energy dispersive X-ray spectroscopy), and a topography roughness of the final layers (may reveal the usage of sputtering).

FIG. 1A to FIG. 1D respectively illustrate a device according to various embodiments in a processing stage of a method according to various embodiments in a schematic cross sectional view or side view.

The device 100a may include a substrate 102, as shown in FIG. 1A. The substrate 102 may include or be formed from a semiconductor material, e.g. silicon.

Further, the device 100b may include a first layer 104 formed at least one of in and over the substrate 102. The first layer 104 may include a surface region 104s distant from the substrate 102. The surface region 104s may define an as-formed surface 104t of the first layer 104 on a side of the first layer 104 opposite the substrate 102.

The first layer 104 may be formed from a paste including solid particles and a polymer binder, e.g. an organic binder.

The paste may be disposed over the substrate 102 by a printing deposition, e.g. stencil printing, screen-printing, or ink-jet printing.

The solid particles may include or be formed from an electrically conductive material, e.g. a metal, e.g. copper. The solid particles may include or be formed from solid matter.

The particles may include or be formed from at least one of the following: nano-particles, in other words, particles having an extension (e.g. a diameter) less than about 100 nm; meso-particles, in other words, particles having an extension in the range from about 100 nm to about 1 µm; and macro-particles in other words, particles having an extension greater than about 1 µm.

The paste may be disposed over the substrate 102 and tempered to remove the polymer components of the paste, e.g. the organic binder (e.g. an organic liquid). By removing the polymer components, the volume of the first layer 104 may decrease. When the particles contact each other, the decrease in volume may stagnate until the first layer 104 reaches a final volume. The remaining polymer components between the particles may be removed leaving voids filled by a gaseous material.

Alternatively or additionally, the first layer 104 may be formed by disposing particles using a plasma over the substrate 102 (also referred to as plasma-dust deposition). The plasma may physically activate the particles such that they react with each other by contact. Optionally, the particle may be tempered.

Tempering may include heating the first layer 104 to a sintering temperature in the range from about 30% of the melting temperature of the particles to about 70% of the melting temperature of the particles.

For example, the sintering temperature may be greater than about 200° C., e.g. greater than about 250° C., e.g. greater than about 300° C., e.g. greater than about 350° C., e.g. greater than about 400° C., e.g. greater than about 500° C., and less than a melting temperature of the particles (in other words, less than a melting temperature of a material of the particles), e.g. less than about 800° C., e.g. less than about 700° C., e.g. less than about 600° C. During tempering, the particles may be sintered. In other words, the particles may be connected to each other without melting to the point of liquefaction. A contact area between the particles may increase during tempering.

The first layer 104, e.g. the surface region 104s, may include or be formed from a pore network (see FIG. 3A) of partially interconnected pores 304t (also referred to as porous structure 702). At least one pore (one or more pores) of the first layer 104 may be opened at the as-formed surface 104t of the first layer 104, which may define a roughness of the first layer 104, e.g. in the range of the particle size. In other words, at least one pore may define an opening extending into the first layer 104.

A roughness (e.g. mean root squared) of the first layer 104 (e.g. of as-formed surface 104t of the first layer 104) may be more than a roughness of the substrate 102 (e.g. of a surface of the substrate covered by the first layer 104), e.g. about double, about fourfold, about tenfold, or more.

The roughness (e.g. a root mean squared roughness) of the first layer 104 before planarization (in other words, the roughness of the as-formed surface 104t) may be in the range from about 0.1 µm to about 50 µm, e.g. in the range from about 1 µm to about 10 µm, e.g. in the range from about 1 µm to about 5 µm.

The device 100c may include the first layer 104 having a planarized surface 104p. The planarized surface 104p may be formed by removing the surface region 104s of the first layer 104, e.g. by at least one of: machining, mechanical polishing, electrochemical polishing, and chemical mechanical polishing. Thereby, the first layer 104 may be thinned.

A thickness 114t of the surface region 104s may be in a range from about 0.1 µm to about 10 µm, e.g. in the range from about 1 µm to about 10 µm, e.g. in the range from about 1 µm to about 5 µm. Alternatively or additionally, the thickness 114t of the surface region 104s may be greater than a roughness of the first layer 104.

During planarization, the roughness (e.g. mean root squared) of the first layer 104 may be reduced. The roughness (e.g. a root mean squared roughness) of the first layer 104 after planarization (in other words, the roughness of the planarized surface 104p) may be less than about 10 µm, e.g. less than about 5 µm, e.g. less than about 2 µm, e.g. less than about 1 µm.

The device 100d may include a second layer 106. The second layer 106 may be formed over the planarized surface 104p. The second layer 106 may be formed using a plasma, e.g. by physical vapor deposition (PVD) using a plasma, e.g. by sputtering.

At least one of the first layer 104 (e.g. the particles) and the second layer 106 may include or be formed from at least one of the following material classes: a semiconductor and a metal. For example, the first layer 104 may include or be formed from at least one metal layer, e.g. a porous metal layer, e.g. a porous copper layer. Alternatively or additionally, the first layer 104 may include or be formed from a semiconductor layer, e.g. a porous semiconductor layer. Alternatively, at least one of the substrate 102 and the first layer 104 also may include or be formed from another material class (e.g. including a porous material), e.g. a ceramic, a glass, a metal oxide, a metal nitride, a metal carbide, a dielectric.

In one embodiment, the first layer 104 and the second layer 106 may differ in a chemical composition, e.g. in a material they are formed from. For example, the second layer 106 may include or be formed from a material class (e.g. a metal) different from the first layer 104.

Alternatively, the first layer 104 and the second layer may be equal in at least one of a material class and a chemical composition, e.g. in a material, e.g. in the metal. For example, both the first layer 104 and the second layer 106 may include or be formed from at least one of the following metals: aluminum, copper, nickel, magnesium, chromium, iron, zinc, tin, gold, silver, iridium, platinum, palladium and titanium.

Optionally, the substrate 102 may include at least one further layer 102i, e.g. formed between the semiconductor material and the first layer 104. The at least one further layer 102i may provide a surface of the substrate 102. The at least one further layer 102i may include or be formed from at least one of: a barrier layer, a passivation layer, a redistribution layer and an adhesion layer. The barrier layer may include or be formed from at least one of titanium and wolfram, e.g. if the substrate 102 or the first layer 104 includes a semiconductor (e.g. silicon). The barrier layer may provide a diffusion length in the barrier layer less than at least one of the substrate 102 and the first layer 104. The adhesion layer may be configured to provide a greater adhesion between two surfaces between which the adhesion layer is formed than the two surfaces in contact to each other. The passivation layer may provide a smaller chemical reactivity than a surface on which the passivation layer is formed. A redistribution layer may include or be formed from an electrically conductive material and may be structured to provide several electrically conductive paths, e.g. interconnecting electronic components of the device 100d.

According to various embodiments, the substrate 102 (e.g. a surface of the substrate), e.g. the at least one further layer 102i, may include or be formed from at least one of: a metal, a semiconductor (also referred to as semiconductor material); for example, an oxide including at least one of the metal or the semiconductor (semiconductor oxide or metal oxide respectively), e.g. silicon oxide; a nitride including at least one of the metal or the semiconductor (semiconductor nitride or metal nitride respectively), e.g. silicon nitride; and a dielectric material including at least one of the metal or the semiconductor (e.g. a semiconductor dielectric or a metal dielectric respectively).

According to various embodiments, the second layer 106 may be formed by at least one of the following: a physical vapor deposition; a printing deposition; and chemical vapor deposition. The second layer may be formed using a fluid free process, e.g. an electrolyte free process. The physical vapor deposition may include or be formed from at least one of sputtering, thermal evaporation and reactive sputtering. The printing deposition may include or be formed from stencil printing, screen-printing, or ink-jet printing. The chemical vapor deposition may include plasma enhancement.

At least one of the first layer 104 and the second layer 106 may include or be formed from at least one of the following materials: a metal, a ceramic, a glass, a metal oxide, a metal nitride, a metal carbide, a dielectric, and a semiconductor. For example, the first layer 104 and the second layer 106 may include or be formed from at least one of: the same metal, the same ceramic, the same glass, the same metal oxide, the same metal nitride, the same metal carbide, the same dielectric, the same semiconductor, and the same chemical composition.

A pore characteristic of the first layer 104 may be greater than a pore characteristic of the second layer 106. For example, a porosity of the first layer 104 may be in the range from about 20% to about 80%, e.g. in the range from about 20% to about 70%, e.g. in the range from about 20% to about 60%, e.g. in the range from about 20% to about 35% or in the range from about 35% to about 60%. A porosity of at least one of the second layer 106 and the substrate 102 may be less than about 20%, e.g. less than about 10%, e.g. less than about 5%, e.g. about 0% (substantially zero).

Figure 2A:
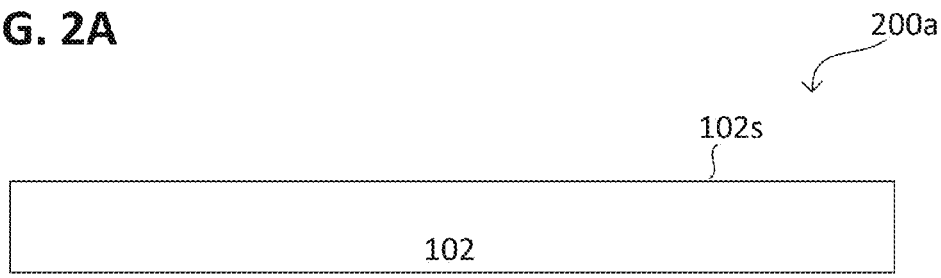
FIGS. 2A to 2C respectively show a device according to various embodiments in a processing stage of a method according to various embodiments in a schematic cross sectional view or side view.
Figure 2B:
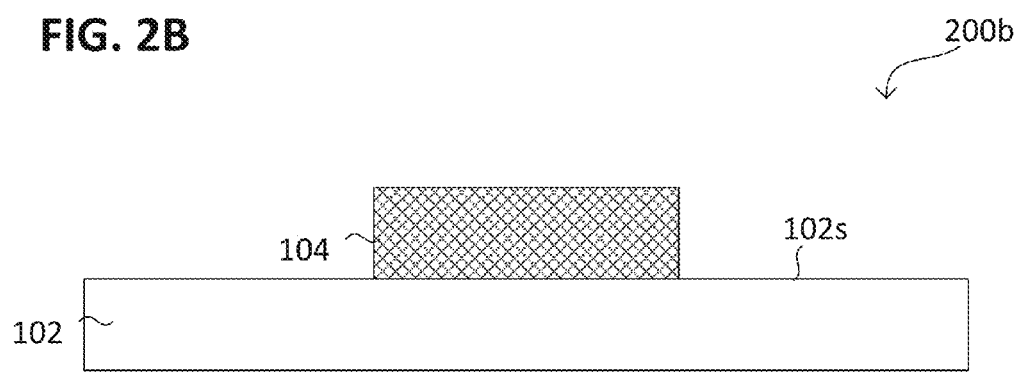
Figure 2C:
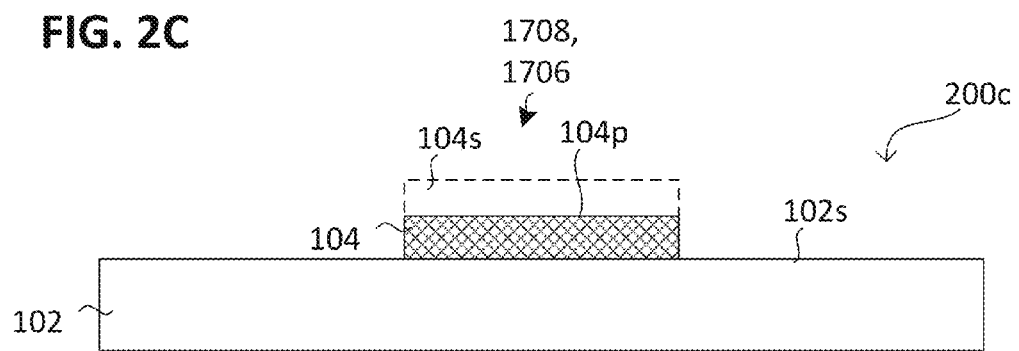

FIGS. 2A to 2C respectively illustrate a device according to various embodiments in a processing stage of a method according to various embodiments in a schematic cross sectional view or side view.

The device 200a may include a substrate 102, as shown in FIG. 2A, e.g. similar to the device 100a.

Further, the device 100b may include a first layer 104 formed at least one of in and over the substrate 102. The first layer 104 may protrude from an exposed surface 102s of the substrate 102.

The device 200c may include the first layer 104 having a planarized surface 104p. The planarized surface 104p may be formed by removing the surface region 104s of the first layer 104, e.g. by at least one of: machining, mechanical polishing, electrochemical polishing, and chemical mechanical polishing. Thereby, the first layer 104 may be thinned.

Optionally, the device 200c may include a second layer 106 over the planarized surface 104p analog to the device 100d.

Optionally, a contact pad 1708, 1706 may be formed including or formed from the first layer 104 and optionally the second layer 106.

Figure 3A:
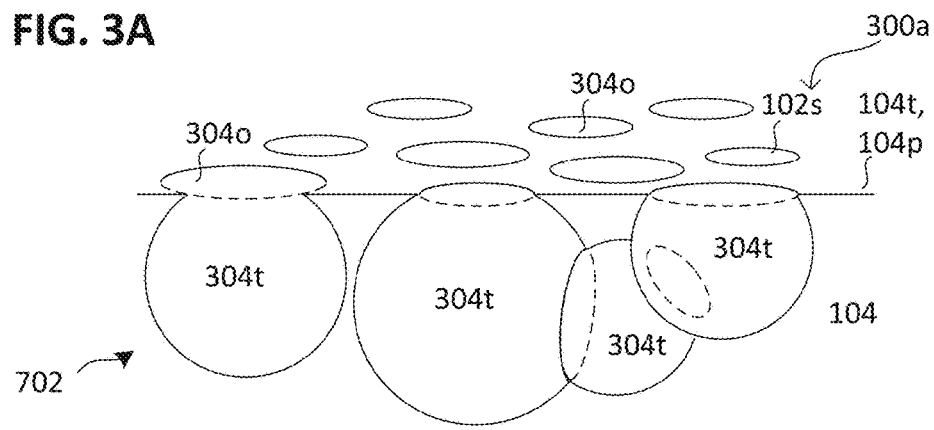
FIGS. 3A to 3D respectively show a device according to various embodiments in a processing stage of a method according to various embodiments in a schematic cross sectional view or side view.

FIG. 3A illustrates a device 300a according to various embodiments in a processing stage of a method according to various embodiments in a schematic cross sectional view or side view.

The first layer 104, e.g. at least one of the planarized surface 104p, the as-formed surface 104t and the surface region 104s, may include or be formed from at least one pore 314t (in other words, one or more pores 314t, e.g. a plurality of pores 314t) extending into the substrate 102. The at least one pore 314t may include or be formed from an opening 304o in the surface 104t, 104p.

According to various embodiments, a size (also referred to as pore size, e.g. a spatially averaged size) of the at least one pore 314t may be in the range from about 0.1 μm to about 10 μm, e.g. in the range from about 0.5 μm to about 10 μm, e.g. in the range from about 1 μm to about 5 μm. The size may define at least one of an extension of the at least one pore 314t parallel to a surface 104t, 104p of the first layer 104 (e.g. the planarized surface 104p or the as-formed surface 104t), e.g. a lateral extension of the opening 304o; and an extension of the at least one pore 314t into the substrate, e.g. perpendicular to the surface 104t, 104p. Through the opening 304o an pore may be opened (also referred to as open-pored surface). In other words, the at least one pore may be opened through the surface 104t, 104p.

The at least one pore 314t may also be referred to as porous structure 702. At least two pores of the porous structure 702 may be interconnected to each other, e.g. by adjoining each other and/or by other pores.

A pore characteristic may include at least one of a spatial pore-density, a spatial pore-size, and a porosity. In other words, the pore characteristic may include a spatial pore-density, a spatial pore-size and/or a porosity.

A pore-density may refer to a number of pores per area or per volume. A spatial pore-size may refer to a spatial pore volume or a spatial pore expansion (extension), e.g. at least one of perpendicular and parallel to the surface 104t, 104p, e.g. a pore diameter. At least one of the spatial pore-size and the pore-density may refer to a spatially averaged value, e.g. averaged over at least one of: the planarized surface 104p, the as-formed surface 104t and the surface region 104s. According to various embodiments the pore network 702 may include or be formed from at least one of the following: micropores, in other words, pores 304t with the extension (e.g. at least one of perpendicular or parallel to the surface 104t, 104p, e.g. a diameter) less than about 2 nm; mesopores, in other words, pores 304t with an extension (e.g. at least one of perpendicular or parallel to the surface 104t, 104p, e.g. a diameter) in the range from about 2 nm to about 50 nm; and macropores in other words, pores 304t with an extension (e.g. at least one of perpendicular and parallel to the surface 104t, 104p, e.g. a diameter) greater than about 50 nm.

A porosity (also referred to as void fraction) may refer to void space in a region, and may be understood as a fraction of the volume of voids over the total volume or total area of the region. A porous layer, region or material may include a porosity in the range from 0.1 to 0.9, or in other words, as a percentage in the range from 10% to 90%. The porosity may refer to a spatially averaged value, e.g. averaged over a region, e.g. at least one of the planarized surface 104p, the as-formed surface 104t, the surface region 104s and the first layer 104. According to various embodiments, the pore-density and the spatial pore-size may define the porosity. Alternatively or additionally, the pore-density and the porosity may define the spatial pore-size. Alternatively or additionally, the porosity and the spatial pore-size may define the pore-density.

Figure 3B:
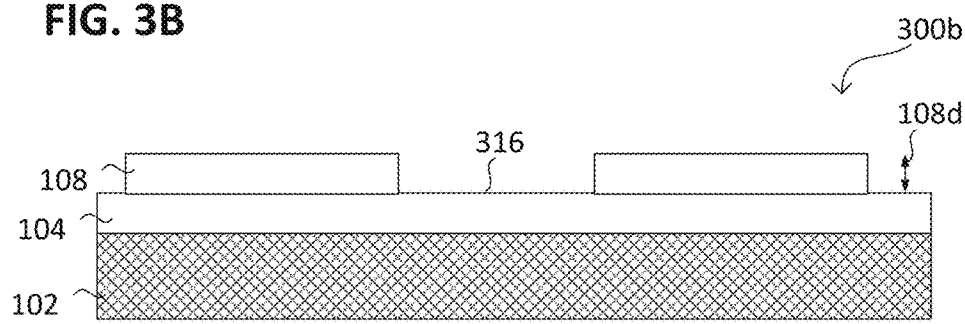
Figure 3C:
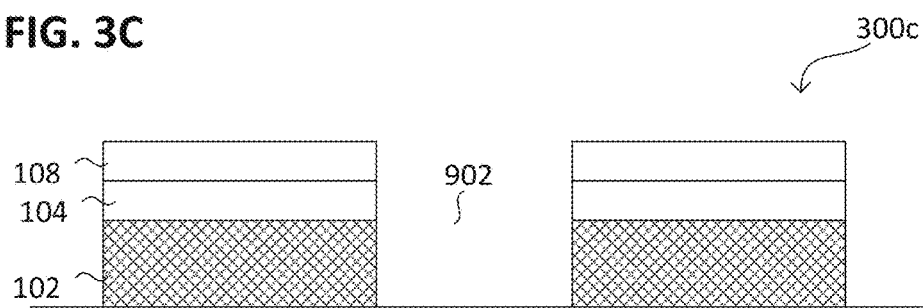
Figure 3D:
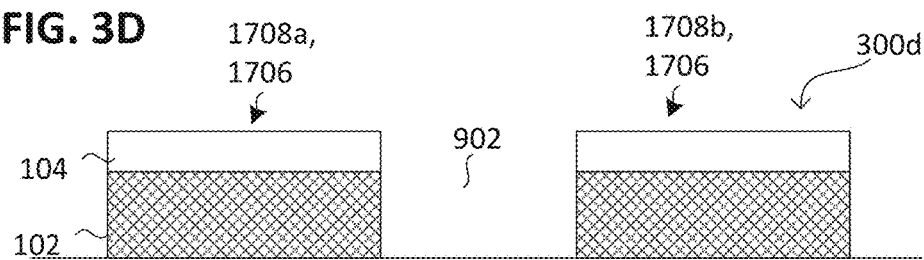

FIGS. 3B to 3D respectively illustrate a device according to various embodiments in a processing stage of a method according to various embodiments in a schematic cross sectional view or side view.

According to various embodiments, the device 300b may include the first layer 104 and the second layer 106. The second layer 106 may partially seal (in other words, partially seal or completely seal) the pores of the first layer 104. The device 300b may further include a mask structure 108 (e.g. a structured polymer layer, e.g. including or formed from a resin) over the second layer 106.

A thickness 108d of the mask structure 108 may be in the range from about 1 μm to about 10 μm. e.g. greater than about 2 μm, e.g. greater than about 4 μm, e.g. greater than about 6 μm, e.g. greater than about 8 μm. The mask structure 108 may be structured, e.g. using photolithography. The mask structure 108 may be structured according to a predetermined pattern (e.g. a mask pattern). After structuring the mask structure 108, at least one processing region 316 of the device 300b may be exposed (in other words, uncovered), e.g. by an opening of the mask structure 108. Alternatively, the mask structure 108 may be formed from a base material according to a predetermined pattern (e.g. a mask pattern). The predetermined pattern may be configured to leave at least one processing region 316 uncovered.

The device 300c may include at least one of the first layer 104 and the second layer 106 being structured. The at least one processing region 316 exposed by the mask structure 108 (exposed region) may be processed, e.g. by wet etching (e.g. using a liquid etchant) or dry etching (e.g. using at least one of a gaseous etchant; a plasma etchant; and an ion etchant). For example, at least one of a trench 902 and a recess 902 may be formed in at least one of the first layer 104 and the second layer 106.

The device 300d may include at least two portions 1706, 1708a, 1708b of at least one of the first layer 104 and the second layer 106 being distant from each other. After structuring, the mask structure 108 may be removed, e.g. using a solvent (e.g. an alkaline fluid, an organic fluid, or a water based fluid).

The at least two portions 1706, 1708a, 1708b may each provide a contact pad. Alternatively, only one portions 1708a may be formed, e.g. similar to the device 200c.

Figure 4A:
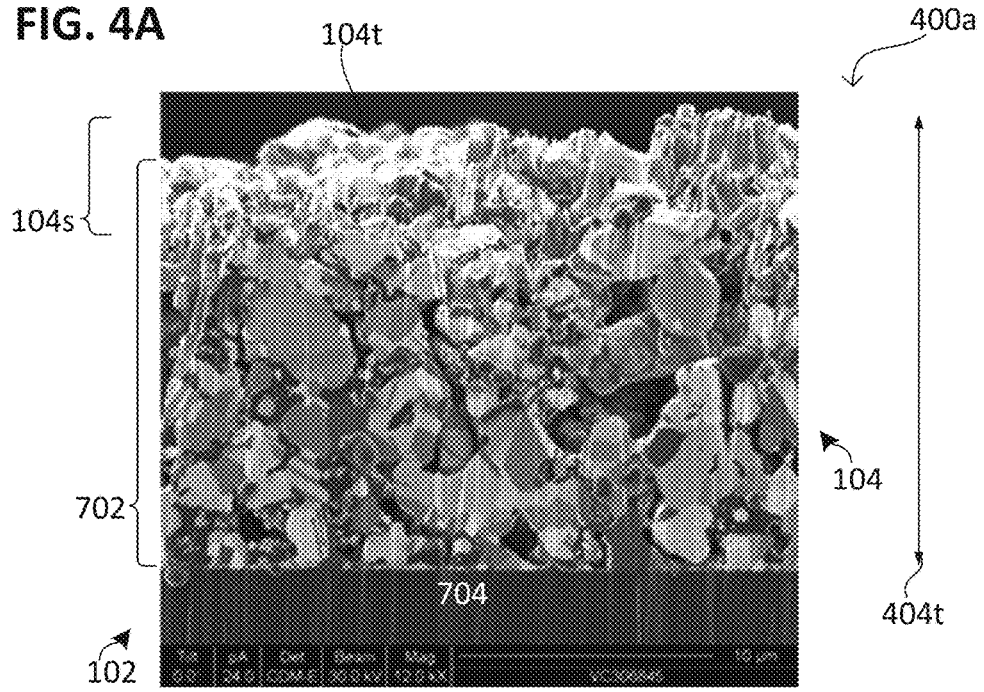
FIGS. 4A and 4B respectively show a device according to various embodiments in a processing stage of a method according to various embodiments in a schematic cross sectional view or side view.

FIG. 4A illustrates a device 400a according to various embodiments in a processing stage of a method according to various embodiments in a schematic cross sectional view or side view.

According to various embodiments, the device 400a may include a porous structure 702 formed in the first layer 104, e.g. over a semiconductor region 704 of the substrate 102.

The porous structure 702 may be formed by a printing process, e.g. a paste printing process (e.g. a stencil printing process and/or a screen-printing process), e.g. a metal paste printing (e.g. using a metal particle-containing paste). Alternatively or additionally, the porous structure 702 may be formed by a plasma dust deposition (e.g. using a dusty plasma).

According to various embodiments, a porosity of the porous structure 702 may be in the range from about 20% to about 80%, e.g. in the range from about 20% to about 70%, e.g. in the range from about 20% to about 50%, e.g. in the range from about 20% to about 30% or in the range from about 30% to about 40%.

According to various embodiments, a pore size (e.g. an spatial averaged pore size) of the porous structure 702 may be in the range from about 0.1 µm to about 10 µm, e.g. in the range from about 0.5 µm to about 10 µm, e.g. in the range from about 1 µm to about 5 µm. The pore size may define at least one of an extension of the pores of the porous structure 702 parallel to the surface 104t, 104p; and an extension of the pores of the porous structure 702 into the substrate, e.g. perpendicular to the as-formed surface 104t.

According to various embodiments, a roughness (e.g. an root mean squared roughness) of the porous structure 702 may be in the range from about 0.1 µm to about 10 µm, e.g. in the range from about 1 µm to about 10 µm, e.g. in the range from about 1 µm to about 5 µm.

According to various embodiments, the porous structure 702 may include or be formed from a plurality of pores. According to various embodiments, at least one pore of the porous structure 702 (e.g. a plurality of pores) may be opened at the as-formed surface 104t.

The porous structure 702 may be formed from particles (also referred to as granular material). The particles may be sintered together, e.g. such that their grains contact each other in an area. During sintering, the particles may be compacted and connected together forming a solid mass of a skeletal structure (also referred to as matrix).

According to various embodiments, the first layer 104 may include or be formed from a porous copper layer, e.g. printed from a paste on the substrate 102 by stencil printing or screen-printing. The paste may include or be formed from copper particles and an organic binder. The as printed first layer 104 may be dried at a drying temperature (e.g. for 1 hour at more than or equal to about 60° C.) to at least partially remove the organic components of the paste and sintered at a sintering temperature, e.g. at 400° C. Drying may provide to remove a liquid component of the paste before sintering. The drying temperature may be less than 30% of the melting temperature of the particles, e.g. less than the evaporation temperature of the liquid component (e.g. an organic solvent).

Heating the first layer 104 may include a heating-up time of about 15 minutes and a holding time at sintering temperature in the range from about 15 minutes to about 90 minutes. During holding at sintering temperature, the organic components of the paste may be removed. The first layer 104 may be heated in a chemically reducing atmosphere, e.g. including a chemically reducing gas (e.g. at least one of formic acid or carbon monoxide) in an inert carrier gas (e.g. at least one of nitrogen or argon). Alternatively, the first metallization 304 may be formed using another solid particle deposition process, e.g. plasma dust deposition.

A porosity of the first layer 104 may be in the range from about 40% to about 50%. A thickness 404t (see also FIG. 1B) of first layer 104 (e.g. before planarizing) may be in the range from about 10 µm to about 10 µm, e.g. in the range from about 10 µm to about 50 µm, e.g. in the range from about 10 µm to about 30 µm, e.g. in the range from about 10 µm to about 20 µm or in the range from about 20 µm to about 30 µm.

Figure 4B:
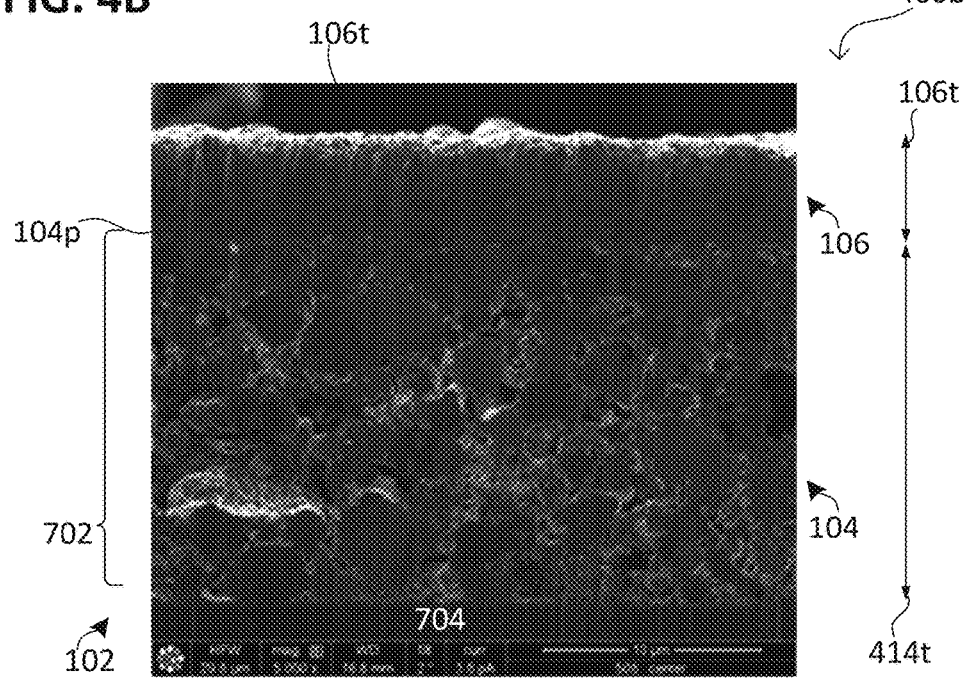

FIG. 4B illustrates a device 400b according to various embodiments in a processing stage of a method according to various embodiments in a schematic cross sectional view or side view.

The device 400b may include the second layer 106 formed over the planarized surface 104p of the first layer 104. The planarized surface 104p may be formed using machining.

The thickness 104t of the first layer 104 may be reduced during planarization to a thickness 414t (see also FIG. 1D), e.g. by at least the value of the roughness of the first layer 104, e.g. by a range from about 0.1 µm to about 10 µm, e.g. in the range from about 1 µm to about 10 µm, e.g. in the range from about 1 µm to about 5 µm. By planarizing the first layer 104, a layer thickness uniformity may be increased, e.g. on wafer level. Alternatively or additionally, a final thickness of the first layer 104 may be adjusted more precisely.

Optionally, an oxide layer of the first layer 104 may be removed from the planarized surface 104p (before forming the second layer 106), e.g. by etching (e.g. by wet or plasma etching).

The second layer 106 may be formed using sputtering. The second layer 106 may include a surface (e.g. as prepared) having a smaller roughness than at least one of the as-formed surface 104t and the surface region 104s.

The second layer 106 may be formed free of pores. For example, the second layer 106 may be formed bulk-like.

A thickness 106t of the second layer 106 may be greater than half of a spatial pore-size of the first layer 104, e.g. greater than the spatial pore-size of the first layer 104, e.g. greater than the double spatial pore-size of the first layer 104. Illustratively, this may result in a sealing of the pores of the first layer 104. Alternatively or additionally, the thickness 106t of the second layer 106 may be smaller than twice the spatial pore-size of the first layer 104. Illustratively, this may lower, e.g. minimizes, a stress-temperature-gradient of the layer structure 104, 106. In other words, a difference of the stress-temperature-gradient between the first layer 104 and the layer structure 104, 106 may be reduced.

The thickness 106t of the second layer 106 may be in a range from about 1 µm to about 10 µm, e.g. in the range from about 2 µm to about 7 µm, e.g. in the range from about 2 µm to about 5 µm.

By adapting a ration (also referred to as thickness ratio) of the thickness 414t of the first layer 104 after planarization (also referred to as planarized thickness 414t) and the thickness 106t of the second layer 106, the mechanical properties of the layer structure 104, 106 (layer stack 104, 106) may be adjusted. By way of example, a hardness or mechanical rigidity may be increased by reducing the thickness ratio.

According to various embodiments, the thickness ratio may be in the range from about 1 to about 100, e.g. in the range from about 1 to about 50, e.g. in the range from about 1 to about 30, e.g. in the range from about 2 to about 20, e.g. in the range from about 3 to about 10, e.g. in the range from about 3.3 to about 4.5.

Optionally, one or more layers may be formed over the second layer 106, for example, at least one layer stack, e.g. which provides a surface for diffusion soldering. By way of example, one or more metallization layers may be formed over the second layer 106.

Illustratively, the first layer 104 may include or be formed from a high porosity and high roughness. During planarization and sputtering, the surface 104t, 104p of the first layer 104 may be sealed.

Figure 5A:
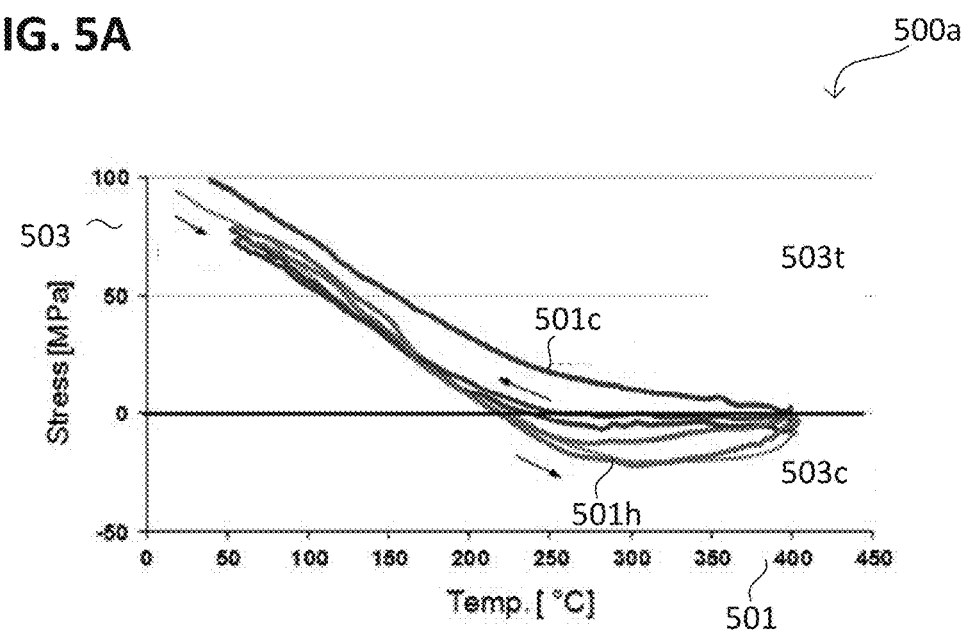
FIGS. 5A and 5B respectively show a schematic diagram according to various embodiments.
Figure 5B:
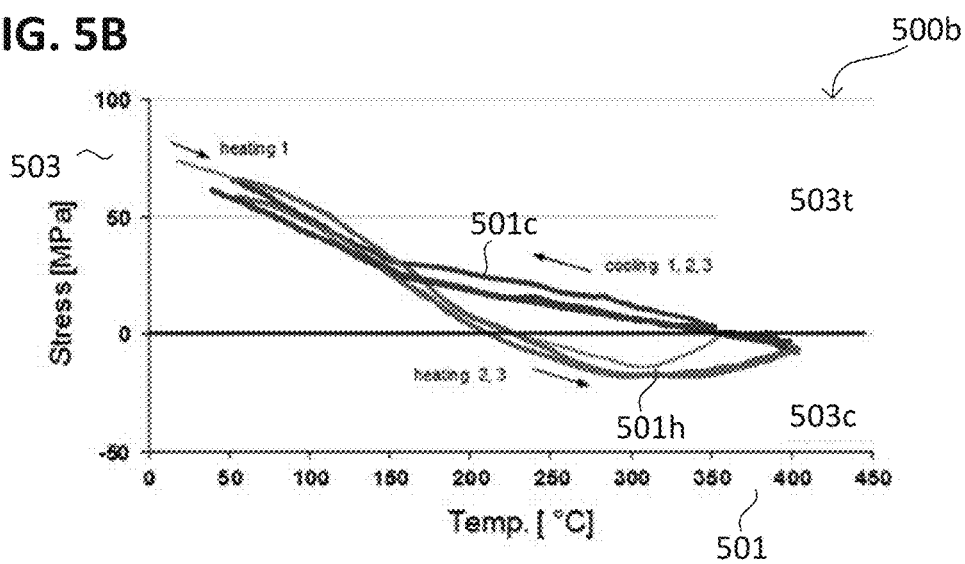

FIGS. 5A and 5B respectively illustrate schematic diagram 500a according to various embodiments.

In the diagram 500*a*, the stress 503 (in Megapascal—MPa) is shown in dependency of the temperature 501 of the layer structure 104, 106. The stress 503 includes a tensile stressed region 503*t* and a compressive stressed region 503*c*. A cooling cycle is represented by line 501*c* and a heating cycle is represented by line 501*h*.

A stress-temperature-gradient for a thickness ratio of about 3.3 (illustrated in diagram 500*a*), e.g. defined by a planarized thickness 414*t* of about 16.8 µm and a thickness 106*t* of the second layer 106 of about 5 µm, may be greater than a stress-temperature-gradient for a thickness ratio of about 4.5 (illustrated in diagram 500*b*), e.g. defined by a planarized thickness 414*t* of about 22.5 µm and a thickness 106*t* of the second layer 106 of about 5 µm.

The stress-temperature-gradient of the layer structure 104, 106 may be in the range from about 0.1 MPa/K to about 1 MPa/K, e.g. in the range from about 0.2 MPa/K to about 0.7 MPa/K, e.g. in the range from about 0.3 MPa/K to about 0.5 MPa/K.

Figure 6A:
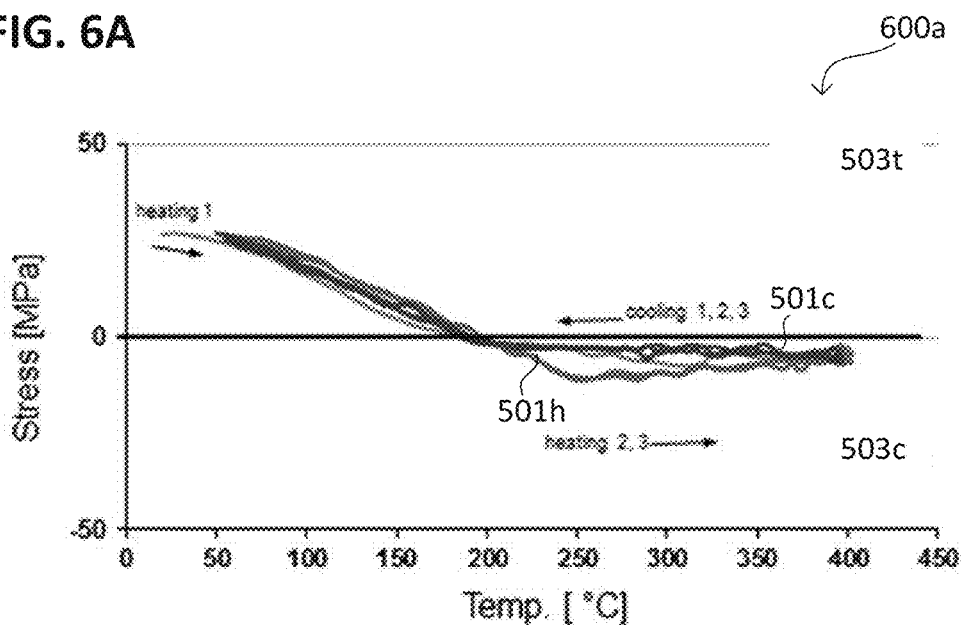
FIGS. 6A and 6B respectively show a schematic diagram according to various embodiments.

FIG. 6A respectively illustrates a schematic diagram 600*a* similar to the diagram 500*a* for layer structure 104, 106 before forming the second layer 106.

In comparison with the diagrams 500*a*, 500*b*, the stress-temperature-gradient is not significantly increased by forming the second layer 106 over the first layer 104. In other words, the first layer 104 may provide a stress compensation region (illustratively, a stress compensation layer 104).

Figure 6B:
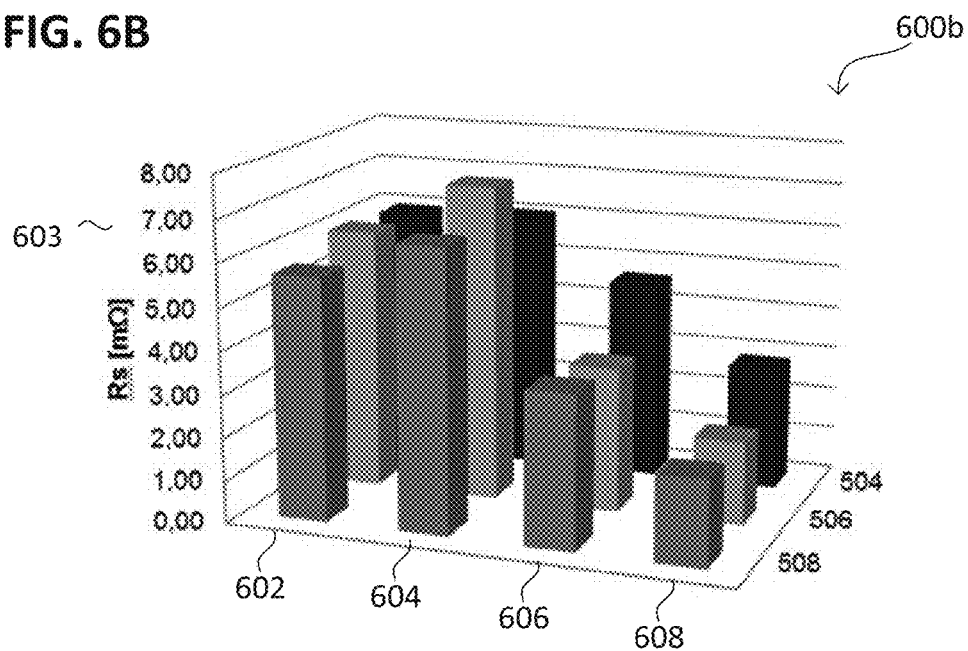

FIG. 6B illustrates a device according to various embodiments in a processing stage of a method according to various embodiments in a schematic diagram 600*b*.

The diagram 600*b* shows a resistance (in Milliohm—mOhm) exemplarily for different layer structures 504, 506, 508 before planarization 602, after planarization 604, after planarization and tempering 604, and after forming 604 the second layer 106.

For a first layer structure 504, in 602 the resistance is about 5.96 mOhm, in 604 the resistance is about 6.05 mOhm, in 606 the resistance is about 4.65 mOhm and in 608 the resistance is about 2.85 mOhm. For a second layer structure 506, in 602 the resistance is about 6.09 mOhm, in 604 the resistance is about 7.34 mOhm, in 606 the resistance is about 3.37 mOhm and in 608 the resistance is about 1.95 mOhm. For a third layer structure 508, in 602 the resistance is about 5.66 mOhm, in 604 the resistance is about 5.58 mOhm, in 606 the resistance is about 2.59 mOhm and in 608 the resistance is about 2.01 mOhm.

For the shown examples, the specific resistance may be reduced from about 8.5 Microohm·centimeter (µOhm·cm) before planarization to 4.55 µOhm·cm after forming 608 the second layer 106.

According to various embodiments, the specific resistance of a layer structure 104, 106 before planarization may be more than about 5 µOhm·cm, e.g. more than about 6 µOhm·cm, e.g. more than about 7 µOhm·cm, e.g. more than about 8 µOhm·cm, e.g. in the range from about 7 µOhm·cm to about 10 µOhm·cm.

The specific resistance of a layer structure 104, 106 after forming the second layer 106 may be less than about 7 µOhm·cm, e.g. less than about 6 µOhm·cm, e.g. less than about 5 µOhm·cm, e.g. less than about 4 µOhm·cm, e.g. in the range from about 3 µOhm·cm to about 7 µOhm·cm.

According to various embodiments, the specific resistance of a layer structure 104, 106 may be reduced by planarization and forming the second layer 106 by more than about 10%, e.g. more than about 20%, e.g. more than about 30%, e.g. more than about 40%, e.g. in the range from about 10% to about 50%.

Alternatively or additionally, the specific resistance of a layer structure 104, 106 may be reduced by planarization and forming the second layer 106 by more than about 1 µOhm·cm, e.g. more than about 2 µOhm·cm, e.g. more than about 3 µOhm·cm, e.g. more than about 4 µOhm·cm, e.g. in the range from about 1 µOhm·cm to about 5 µOhm·cm.

Figure 7A:
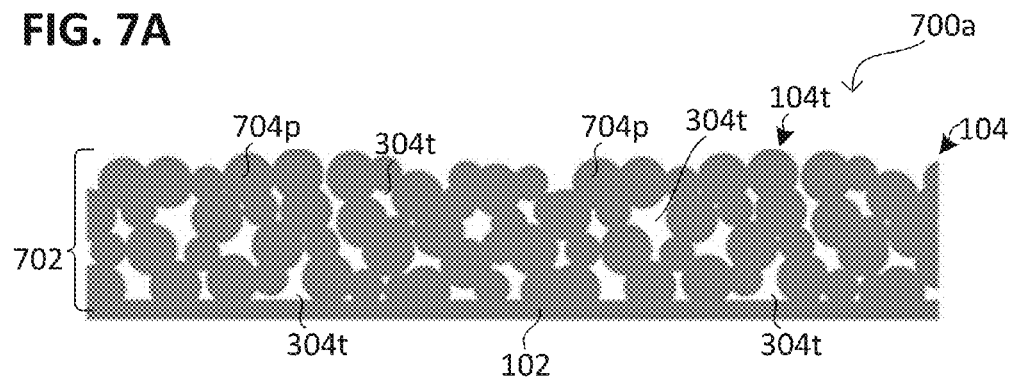
FIGS. 7A to 7C respectively show a device according to various embodiments in a processing stage of a method according to various embodiments in a schematic cross sectional view or side view.
Figure 7B:
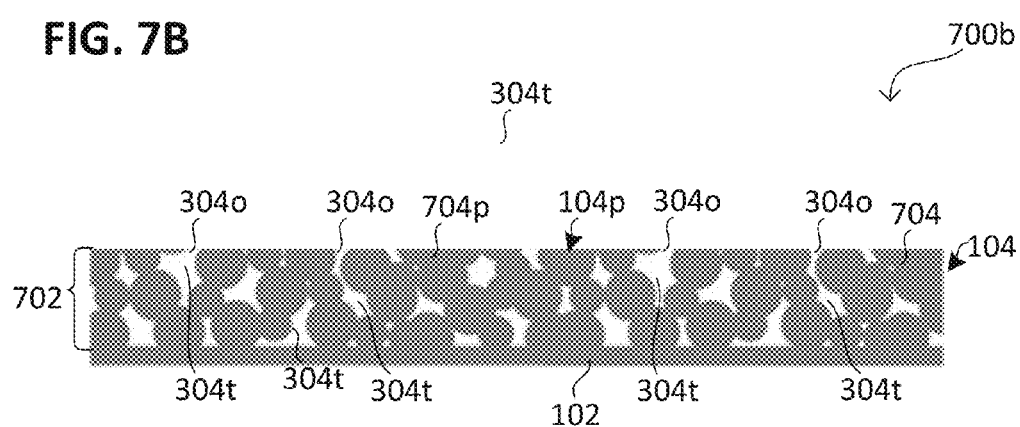
Figure 7C:
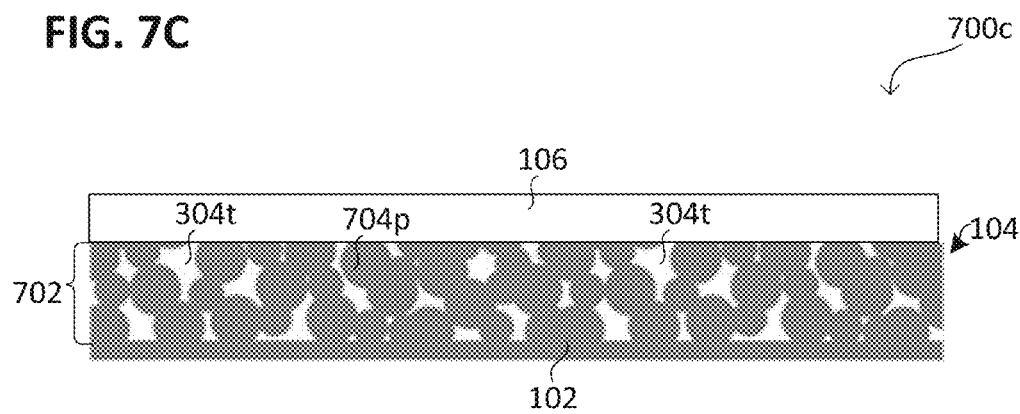

FIGS. 7A to 7C respectively illustrate a device according to various embodiments in a processing stage of a method according to various embodiments in a schematic cross sectional view or side view.

The device 700*a* may include the first layer 104 formed over the substrate 102. The first layer 104 may be formed by sintering a granular material. The granular material may include or be formed from a plurality of particles 704*p*. After sintering the granular material, the first layer 104 may include or be formed from a porous structure 702 (e.g. including a network of partially interconnected pores 304*t*).

The size (e.g. an averaged extension) of the particles 704*p* before sintering may be in the range from about 0.1 µm to about 10 µm, e.g. in the range from about 1 µm to about 10 µm, e.g. in the range from about 1 µm to about 5 µm.

The device 700*b* may include the first layer 104 including a planarized surface 104*p*. The planarized surface 104*p* may be formed by at least one of: machining, mechanical polishing, electrochemical polishing, and chemical mechanical polishing. The planarized surface 104*p* may be formed after sintering the granular material. The planarized surface 104*p* may be open-pored 304*o*, in other words, the pores 304*t* of the first layer 104 may include openings in the planarized surface 104*p*.

By planarizing the first layer 104, the roughness of the first layer 104 may be reduced. In other words, the roughness of the planarized surface 104*p* may be less than a roughness of the as-formed surface 104*t*. By way of example, planarizing first layer 104 layer may be configured to reduce the roughness of the first layer 104 to a value less than at least one of a spatial pore-size of the first layer 104 and a spatial particle size of the first layer 104.

The device 700*c* may include the second layer 106 formed over the planarized surface 104*p*. The second layer 106 may seal the pores 304*t* of the planarized surface, e.g. cover the openings 304*o* of the pores 304*t*.

The second layer 106 may include or be formed from at least one (e.g. spatially averaged) characteristic selected from the following characteristics: a pore characteristic smaller than the first layer 104; a hardness greater than the first layer 104; a specific resistivity smaller than the first layer 104; a stress-temperature-gradient greater than the first layer 104; or a density greater than the first layer 104.

Figure 8A:
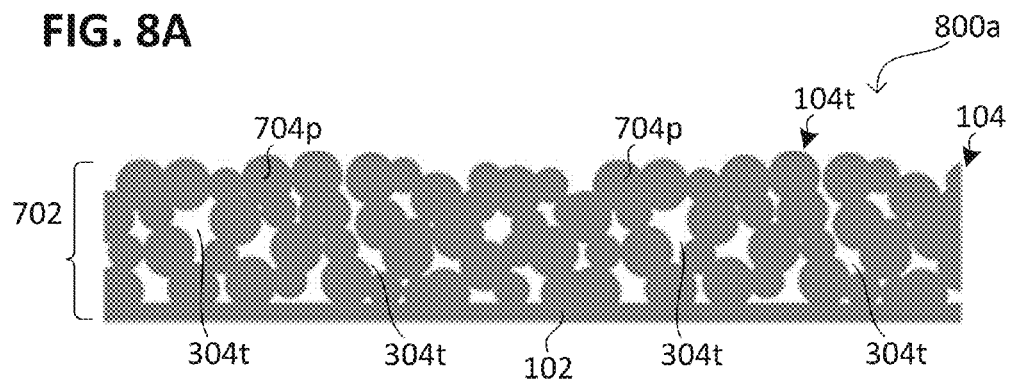
FIGS. 8A to 8C respectively show a device according to various embodiments in a processing stage of a method according to various embodiments in a schematic cross sectional view or side view.
Figure 8B:
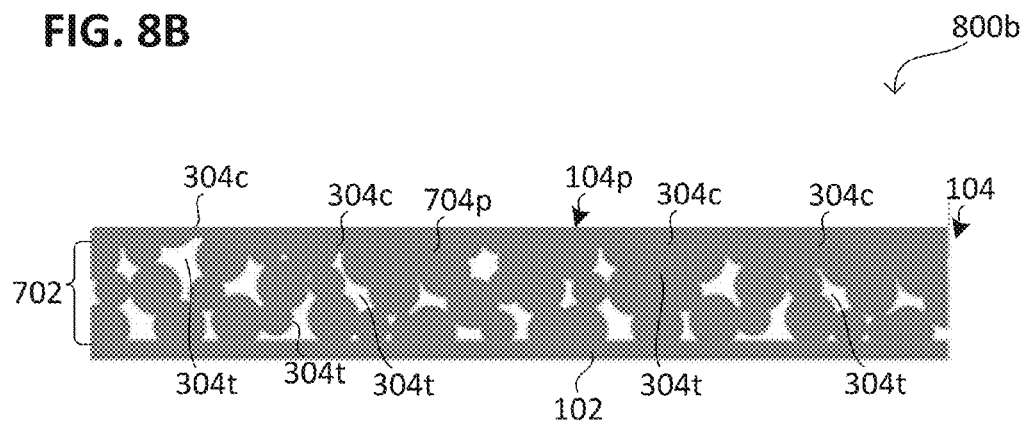
Figure 8C:
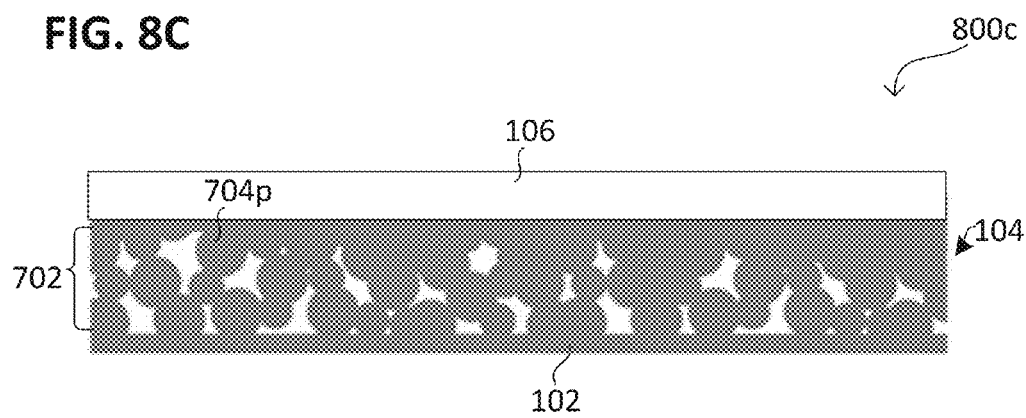

FIGS. 8A to 8C respectively illustrate a device according to various embodiments in a processing stage of a method according to various embodiments in a schematic cross sectional view or side view.

The device 800*a* may include the first layer 104 over the substrate 102. The first layer 104 may be formed by sintering a granular material. The granular material may include or be formed from a plurality of particles 704*p*. After sintering the granular material, the first layer 104 may include or be formed from a porous structure 702.

The device 800*b* may include the first layer 104 including a planarized surface 104*p*. The planarized surface 104*p* may be formed by at least one of machining, mechanical polishing, electrochemical polishing, and chemical mechanical polishing. The planarized surface 104*p* may be formed after sintering the granular material. The planarized surface 104*p* may optionally be closed-pored 304*c*, in other words, the pores 304t of the first layer 104 may at least partially be sealed by the planarized surface 104p.

Planarizing the first layer 104 may include deforming a material of the first layer 104, e.g. the particles 704p. Therefore, the material of the first layer 104 may at least one of at least partially seal and at least partially fill the pores 304t. Illustratively, planarizing may include pressing onto the first layer 104 to deform the material of the first layer 104. A first portion of the material of the first layer 104 may be removed and a second portion of the material of the first layer 104 may be deformed. Sealing the pores may facilitate to form the second layer 106 over the first layer 104.

During planarizing the first layer 104 a pore characteristic of the surface 104t, 104p (e.g. the surface layer 104s) of the first layer 104 may be increased. By way of example, a gradient in at least one pore-characteristic may be formed by planarizing the first layer 104. In other words, at least one of a pore-density, a pore-size and a porosity may be reduced at the surface 104t, 104p by planarizing the first layer 104.

At least one pore-characteristics of the first layer 104 distant from the substrate 102 may be less than proximate the substrate 102. By way of example, the gradient may be directed towards the substrate 102.

At least one pore-characteristics of the first layer 104 (e.g. of the planarized layer 104p) may be reduced by planarization by more than about 10%, e.g. more than about 20%, e.g. more than about 30%, e.g. more than about 40%, e.g. more than about 50%, e.g. more than about 60%, e.g. more than about 70%, e.g. more than about 80%, e.g. more than about 90%, e.g. about 100%. By way of example, at least one pore-characteristics of the first layer 104 may be reduced to about zero by planarization. In that case, the pores 304t of the first layer 104 may be sealed completely after planarization.

The device 800c may include the second layer 106 formed over the planarized surface 104p. If necessary, the second layer 106 may seal the pores 304t of the planarized surface, e.g. the remaining openings 304o of the pores 304t.

FIG. 9 illustrates a method 900 according to various embodiments in schematic flow diagram.

The method 900 may include in 902 forming at least one electronic component in a substrate. The method 900 may further include in 904 forming a contact pad in electrical contact with the at least one electronic component. Forming the contact includes in 906: forming a first layer over the substrate; planarizing the first layer to form a planarized surface of the first layer; and forming a second layer over the planarized surface. The second layer has a lower porosity than the first layer.

Figure 10A:
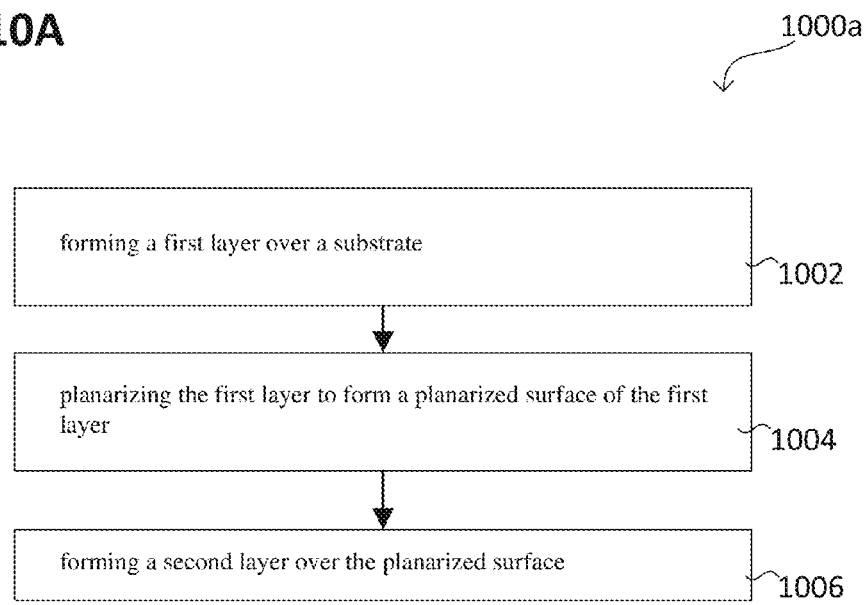
FIGS. 10A and 10B respectively show a method according to various embodiments in schematic flow diagram.

FIG. 10A illustrates a method 1000a according to various embodiments in schematic flow diagram.

The method 1000a may include in 1002 forming a first layer over a substrate. The method 1000a may further include in 1004 planarizing the first layer to form a planarized surface of the first layer. The method 1000a may further include in 1006 forming a second layer over the planarized surface.

Optionally, a porosity of the first layer may be greater than at least one of a porosity of the substrate and a porosity of the second layer.

Optionally, the second layer may be formed by physical vapor deposition.

Optionally, the first layer and the second layer may be formed from the same material (e.g. the same solid material).

Figure 10B:
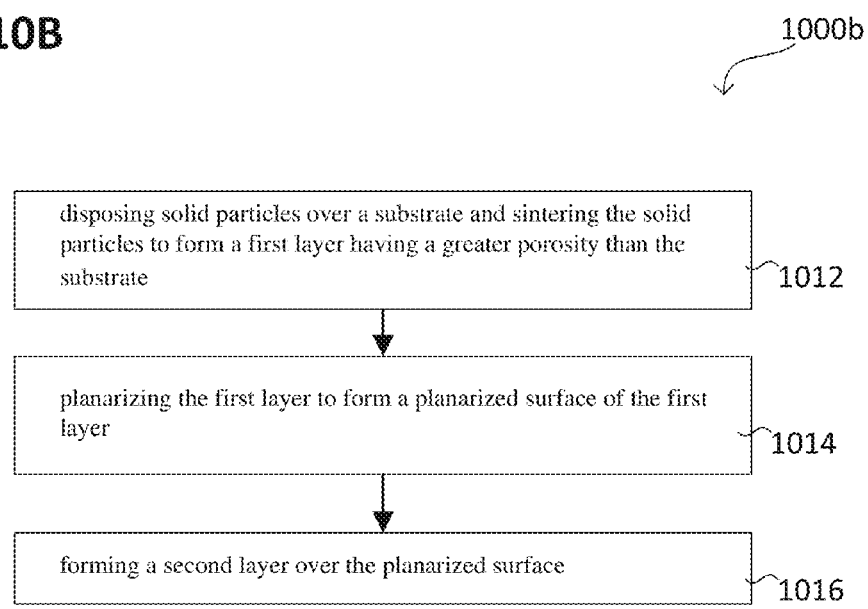

FIG. 10B illustrates a method 1000b according to various embodiments in schematic flow diagram.

The method 1000b may include in 1012 disposing solid particles over a substrate and sintering the solid particles to form a first layer having a greater porosity than the substrate. The method 1000b may further include in 1014 planarizing the first layer to form a planarized surface of the first layer. The method 1000b may further include in 1016 forming a second layer having a lower porosity than the first layer over the planarized surface.

Optionally, the second layer may be formed by a physical vapor deposition, e.g. by sputtering.

Figure 11A:
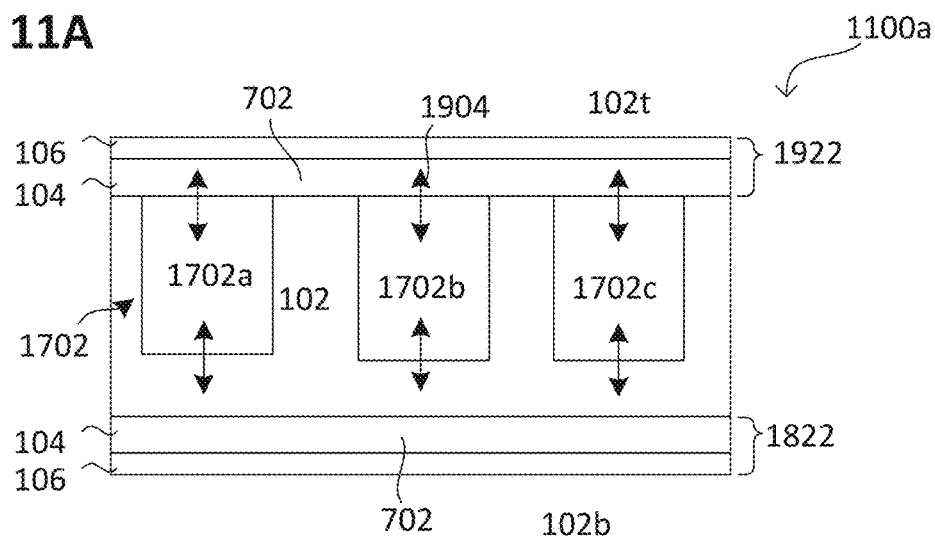
FIGS. 11A and 11B respectively show a device according to various embodiments in a processing stage of a method according to various embodiments in a schematic cross sectional view or side view.

FIG. 11A illustrates a semiconductor device 1100a according to various embodiments in a processing stage of a method according to various embodiments in a schematic cross sectional view or side view.

According to various embodiments, the semiconductor device 1100a may include a plurality of electronic components (also referred to as semiconductor circuit elements) 1702a, 1702b, 1702c electrically connected 1904 in parallel to each other and in electrical contact with one or more layer structures 104, 106.

The semiconductor device 1100a may include a first metallization 1922 on a first side 102t of the substrate 102, the first metallization 1922 may optionally include or be formed from the first layer 104 and the second layer 106. Each electronic component of the plurality of electronic components 1702a, 1702b, 1702c may be electrically connected 1904 to the first metallization 1922.

Alternatively or additionally, the semiconductor device 1100a may include a second metallization 1822 on a second side 102b of the substrate 102, the second metallization 1822 may optionally include or be formed from the first layer 104 and the second layer 106. Each electronic component of the plurality of electronic components 1702a, 1702b, 1702c may be electrically connected 1904 to the second metallization 1822.

For example, at least one contact pad 1706, 1708a, 1708b (see for example, FIG. 3 or FIG. 11B) may be formed from at least one of the first metallization 1922 and the second metallization 1822. Alternatively, a redistribution layer may be formed from at least one of the first metallization 1922 and the second metallization 1822.

Each electronic component of the plurality of electronic components 1702a, 1702b, 1702c may include or be formed from a diode structure (also referred to as diode cell) or a transistor structure (also referred to as transistor cell). The plurality of electronic components 1702a, 1702b, 1702c may be part of or form a power electronic component 1702. By way of example, each electronic component of the plurality of electronic components 1702a, 1702b, 1702c (e.g. the power electronic component 1702) may include or be formed from a transistor (e.g. a power transistor). Alternatively or additionally, each electronic component of the plurality of electronic components 1702a, 1702b, 1702c (e.g. the power electronic component) may include or be formed from a vertical structure. A vertical structure may be understood as providing a current flow from the first side 102t of the substrate 102 to the second side 102b of the substrate 102 or vice versa. Alternatively or additionally, each electronic component of the plurality of electronic components 1702a, 1702b, 1702c (e.g. the power electronic component 1702) may include at least one gate contact pad. The at least one gate contact pad may be provided by (e.g. formed from) the first metallization 1922 (if present).

According to various embodiments, the second layer 106 may be at least one of the following: a protection layer, a solderable layer, a bondable layer, and a pore-sealing layer. The protection layer may optionally include or be formed from a metallic hart-coating.

Figure 11B:
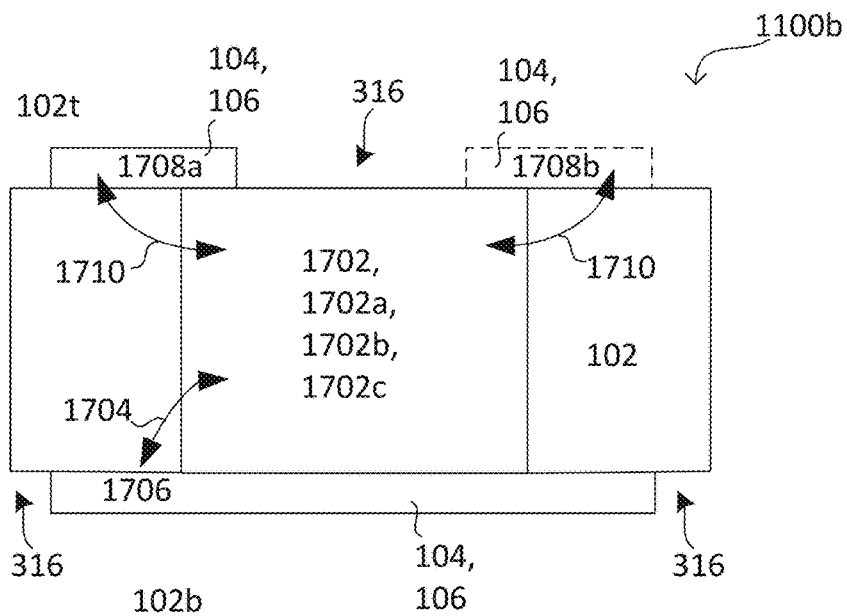

FIG. 11B illustrates a semiconductor device 1100*b* according to various embodiments in a processing stage of a method according to various embodiments in a schematic cross sectional view or side view.

The semiconductor device 1100*b* may include at least one electronic component 1702*a*, 1702*b*, 1702*c*, e.g. a power electronic component 1702, formed at least one of over and in the semiconductor region. By way of example, the at least one electronic component 1702*a*, 1702*b*, 1702*c*, 1702 may include or be formed from at least one transistor (in other words, one or more transistors) in electrical contact 1704 to at least one layer structure 104,106. The electronic component 1702*a*, 1702*b*, 1702*c*, 1702 may include or be formed from insulated-gate bipolar transistor.

According to various embodiments, the semiconductor device 1100*b* may include at least one first contact pad 1706 (e.g., at least one collector contact pad 1706). The at least one first contact pad 1706 may be electrically connected to the at least one electronic component 1702*a*, 1702*b*, 1702*c*, 1702. Optionally, the at least one first contact pad 1706 may be formed by structuring the layer structure 104, 106 as described before.

Alternatively or additionally, the semiconductor device 1100*b* may include at least one second contact pad 1708*a*, 1708*b* (e.g. a source/drain contact pad 1706) formed in electrical contact 1710 to the at least one electronic component 1702*a*, 1702*b*, 1702*c*, 1702. The at least one second contact pad 1708*a*, 1708*b* may optionally include a gate contact pad 1708*b*, e.g. which may be formed electrically insulated from the substrate 102. Optionally, the at least one second contact pad 1708*a* may be formed by structuring the layer structure 104, 106 as described before.

In other words, at least one of the at least one first contact pad 1706 and the at least one second contact pad 1708*a*, 1708*b* may include the layer structure 104, 106.

A method of forming a device 1100*a*, 1000*b* may include: forming an active chip area including at least one electronic component 1702*a*, 1702*b*, 1702*c*, 1702 at least one of in and over a substrate 102; forming at least one contact pad 1706, 1708*a*, 1708*b* in electrical contact with the active chip area. The at least one contact pad 1706, 1708*a*, 1708*b* may include or be formed from a first layer 104 and a second layer 106, the first layer 104 disposed between the second layer 106 and the active chip area. The second layer 106 includes at least one of: a pore characteristic less than the first layer 104; a hardness greater than the first layer 104; a specific resistivity smaller than the first layer 104; a stress-temperature-gradient greater than the first layer 104; and a density greater than the first layer 104. The first layer 104 may include or be formed from a porous stress-compensation layer to provide a stress-temperature-gradient less than at least one of the first layer 104 and the substrate 102.

FIG. 12A illustrates a semiconductor device 1200*a* according to various embodiments in a processing stage of a method according to various embodiments in a schematic cross sectional view or side view, e.g. an electronic component 1702*a*, 1702*b*, 1702*c*, e.g. a power electronic component 1702.

The semiconductor device 1200*a* may include the doped semiconductor layer 1081 formed on a second side 102*b* of the substrate. The doped semiconductor layer 1081 may include or be formed from a first doping type. The doped semiconductor layer 1081 may include or be formed from a collector region (a doped region in form of a collector region).

The semiconductor device 1200*a* may further include a first contact pad 1706 in form of a collector contact pad 1706 (e.g. a drain contact pad). The first contact pad 1706 may electrical contact the doped semiconductor layer 1081. The first contact pad 1706 may include or be formed from the layer structure 104, 106. The first contact pad 1706 may cover more than half of the doped semiconductor layer 1081, e.g. cover the doped semiconductor layer 1081 substantially completely (e.g. more than about 80% of the doped semiconductor layer 1081).

Further, the semiconductor device 1200*a* may include a first doped region 2006 (first doped semiconductor region 2006). The first doped region 2006 may include or be formed from a base region. The first doped region 2006 may include (e.g. a dopant having) a doping type equal to the doped semiconductor layer 1081 (in other words, the dopant of the doped semiconductor layer 1081), e.g. a first doping type. The semiconductor device 1200*a* may further include a second contact pad 1708*a* electrical contacting the first doped region 2006. The second contact pad 1708*a* may include or be formed from an emitter contact pad 1708*a* (e.g. a source contact pad 1708*a*). The second contact pad 1708*a* may include or be formed from the layer structure 104, 106.

Further, the semiconductor device 1200*a* may include a second doped region 2004 formed between the first doped region 2006 and the doped semiconductor layer 1081. The second doped region 2004 may include or be formed from a drift region. The second doped region 2004 may include a doping type (second doping type) different from the doped semiconductor layer 1081, e.g. a dopant having a second doping type. The second doped region 2004 may optionally include an epitaxially formed layer.

The semiconductor device 1200*a* may further include a further second contact pad 1708*b*. The further second contact pad 1708*b* may include or be formed from a gate contact pad 1708*b*. The further second contact pad 1708*b* may be formed electrical insulated from the second doped region 2004, e.g. by an electrically insulating layer formed between the further second contact pad 1708*b* and the second doped region 2004. The further second contact pad 1708*b* may include or be formed from the layer structure 104, 106.

Further, the semiconductor device 1200*a* may include a third doped region 2008. The third doped region 2008 may include or be formed from an emitter region. The third doped region 2008 may include (e.g. a dopant having) a doping type different from the doped semiconductor layer 1081, e.g. the second doping type. A dopant concentration of the third doped region 2008 may be greater than of the second doped region 2004.

Optionally, the semiconductor device 1200*a* may include a fourth doped region 2002 between the second doped region 2004 and the doped semiconductor layer 1081. The fourth doped region 2002 may include or be formed from a field stop region. The fourth doped region 2002 may include a dopant having a doping type different from the doped semiconductor layer 1081. The fourth doped region 2002 may include a dopant concentration higher than the second doped region 2004.

The first doping type may be an n-doping type and the second doping type may be a p-doping type. Alternatively, the first doping type may be the p-doping type and the second doping type may be the n-doping type.

The semiconductor device 1200*a*, e.g. an electronic component 1702, may include or be formed from a transistor structure, e.g. a planar transistor structure (e.g. providing a vertical current flow). A transistor structure may include or be formed from a plurality of p-n junctions. A p-n junction may be formed by an interface of two doped regions differing in their doping types, e.g. an interface between at least one the following: the first doped region 2006 and the second doped region 2004; the first doped region 2006 and the third doped region 2008; the second doped region 2004 and the doped semiconductor layer 1081; or the second doped region 2004 and the fourth doped region 2002 (if present).

The electronic component 1702 may include or be formed from insulated-gate bipolar transistor.

FIG. 12B illustrate a device 1200b according to various embodiments in a processing stage of a method according to various embodiments in a schematic cross sectional view or side view. The semiconductor device 1200b may include the doped semiconductor layer 1081 formed on the second side 102b. The doped semiconductor layer 1081 may include or be formed from a first doping type. The doped semiconductor layer 1081 may include or be formed from a first junction region.

The semiconductor device 1200b may further include a first contact pad 1706 electrical contacting the doped semiconductor layer 1081. The first contact pad 1706 may include or be formed from an electrode contact pad. The first contact pad 1706 may include or be formed from the layer structure 104, 106. The first contact pad 1706 may substantially cover the doped semiconductor layer 1081.

Further, the semiconductor device 1200b may include a first doped region 2006. The first doped region 2006 may include or be formed from a second junction region. The first doped region 2006 may include a dopant having a doping type different from the doped semiconductor layer 1081 (in other words, the dopant of the doped semiconductor layer 1081), e.g. the second doping type. The semiconductor device 1200b may further include a second contact pad 1708a electrical contacting the first doped region 2006. The second contact pad 1708a may include or be formed from a further electrode contact pad. The second contact pad 1708a may include or be formed from the layer structure 104, 106.

Optionally, the semiconductor device 1200b may include a second doped region 2002 between the first doped region 2006 and the doped semiconductor layer 1081. The second doped region 2002 may include or be formed from a field stop region. The second doped region 2002 may include (e.g. a dopant having) a doping type equal to the doped semiconductor layer 1081. The second doped region 2002 may include a dopant concentration higher than the first doped region 2006.

The semiconductor device 1200b, e.g. an electronic component 1702b, 1702b, 1702b, e.g. a power electronic component 1702, may include or be formed from a diode structure, e.g. a planar diode structure (providing a vertical current flow). A diode structure may include or be formed from a p-n junction, e.g. formed by an interface of two doped regions differing in their doping types, e.g. an interface between the first doped region 2006 and the doped semiconductor layer 1081 or an interface between the second doped region 2002 (if present) and the first doped region 2006.

Optionally, the doped semiconductor layer 1081 may include or be formed from a plurality of first segments including the first doping type and a plurality of second segments including the second doping type. The segments of the plurality of first segments and the segments of the plurality of second segments may be disposed in an alternating order. In this case, the doped semiconductor layer 1081 may be part of backward-diode structure.

Figure 13A:
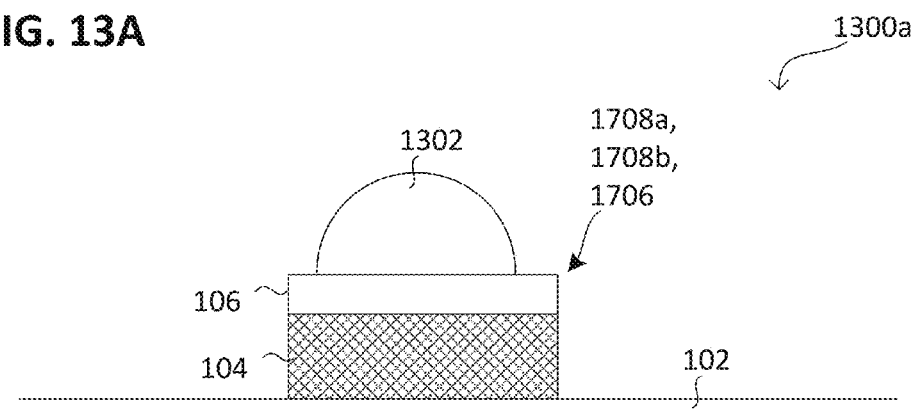
FIGS. 13A and 13B respectively show a device according to various embodiments in a processing stage of a method according to various embodiments in a schematic cross sectional view or side view.
Figure 13B:
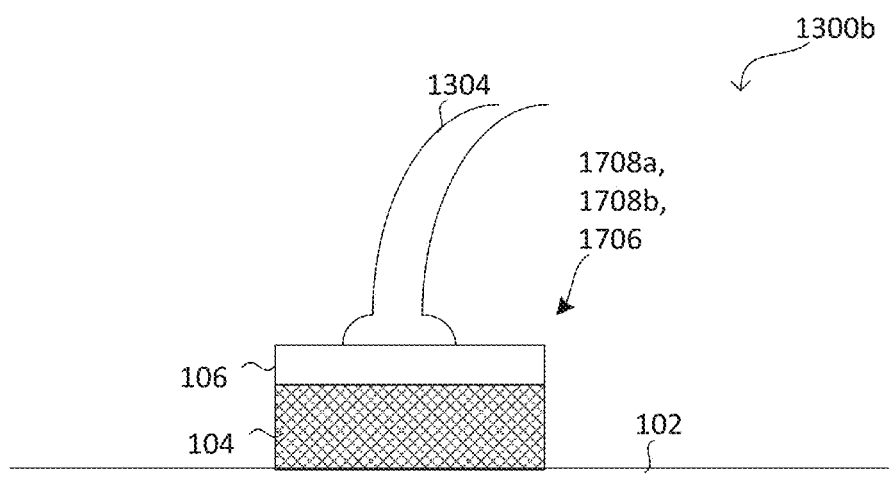

FIGS. 13A and 13B respectively show a device according to various embodiments in a processing stage of a method according to various embodiments in a schematic cross sectional view or side view.

The device 1300a may include the first layer 104 and the second layer 106. Further the device 1300a may include a solder joint 1302 formed over the first layer 104, e.g. over the second layer 106, e.g. in electrical contact with the second layer 106. The first layer 104 may be in electrical contact with at least one of the substrate 102 and the second layer 106. By way of example, at least one contact pad 1708a, 1708b, 1706 may be electrically contacted by the solder joint 1302.

The solder joint 1302 may include or be formed from a solder material. The solder material may include or be formed from at least one metal of the following metals: lead (Pb), tin (Sn), silver (Ag), aluminum (Al). Optionally, the solder material may include or be formed from a metal alloy (also referred as to solder alloy) including at least one metal of the following metals: Pb, Sn, Ag, Al. By way of example, the solder alloy may be a Sn based solder alloy or a Pb based solder alloy. The solder alloy may optionally include alloying elements, such as magnesium (Mg), zinc (Zn), zirconium (Zr), nickel (Ni), palladium (Pd), or gold (Au).

The device 1300b may include the first layer 104 and the second layer 106. Further the device 1300b may include a bonding joint 1304 formed over the first layer 104, e.g. over the second layer 106, e.g. in electrical contact with the second layer 106. The first layer 104 may be in electrical contact with at least one of the substrate 102 and the second layer 106. By way of example, at least one contact pad 1708a, 1708b, 1706 may be electrically contacted by the bonding joint 1304.

The bonding joint 1304 may include or be formed from a bonding material. The bonding material may include or be formed from at least one metal of the following metals: Ag, Al, Au, copper (Cu). Optionally, the bonding material may include or be formed from a metal alloy (also referred as to bonding alloy) including at least one metal of the following metals: Ag, Al, Au, Cu. By way of example, the bonding alloy may be an Ag based alloy (in other words, an alloy including predominantly Ag) or an Al based alloy. The bonding alloy may optionally include alloying elements, such as Mg, Zn, Zr, Sn, Ni, and Pd.

Figure 14A:
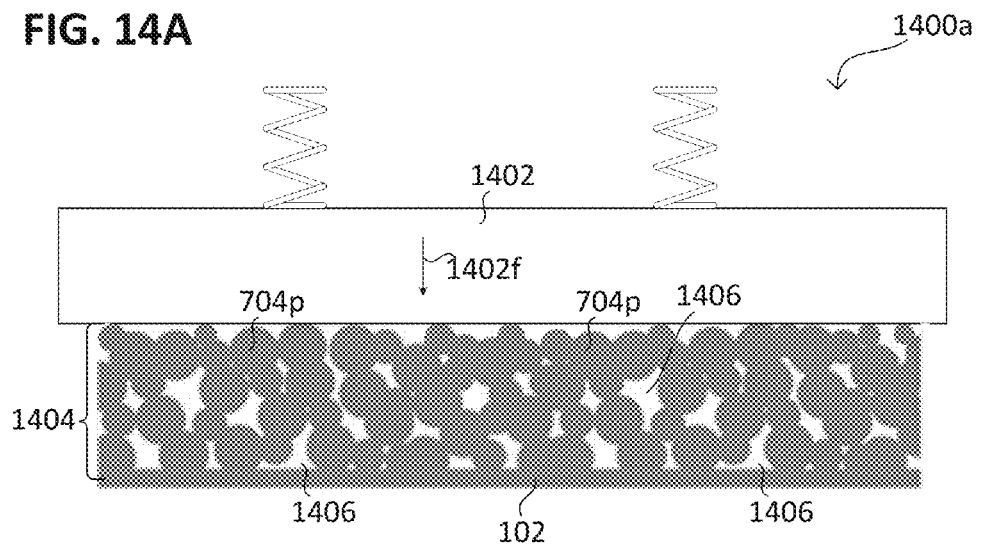
FIGS. 14A and 14B respectively show a device according to various embodiments in a processing stage of a method according to various embodiments in a schematic cross sectional view or side view.
Figure 14B:
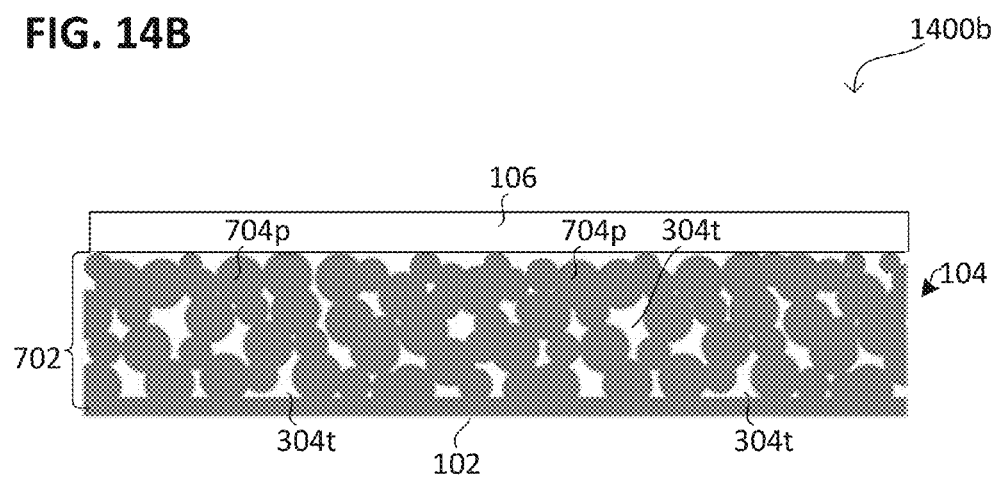

FIGS. 14A and 14B respectively show a device according to various embodiments in a processing stage of a method according to various embodiments in a schematic cross sectional view or side view.

The device 800a may include the first layer 104 over the substrate 102. The first layer 104 may include or be formed from a granular material. The granular material may include or be formed from a plurality of particles 704p. The first layer 104 may be formed from a paste 1404 including the particles 704p and an organic binder 1406.

The first layer 104 may be planarized by pressing the first layer 104, e.g. using a pressing tool 1402. The pressing tool 1402 (e.g. a pressing stamp) may apply a force 1402f to the first layer 104 to compact the first layer 104. By pressing the first layer 104, at least one of the roughness of the first layer 104 may be reduced, and the density of the first layer 104 may be increased. During pressing, the first layer 104 may be dried, e.g. to remove liquid components of the paste.

Optionally, the first layer 104, e.g. at least the surface of the first layer 104, may be densified. By densifying (also referred to as compacting), at least one pore characteristic may be reduced.

The compacted surface of the first layer 104 may optionally provide the form the second layer 106 by electro-deposition, e.g. electroplating.

During pressing the first layer 104, the granular material may be heated to remove the organic binder 1406. Further, during pressing the first layer 104, the granular material may be sintered. In other words, the first layer 104 may be planarized before or during sintering.

The device 1400b may include the second layer 106 formed over the first layer 104 as described before.

Further, various embodiments will be described in the following.

1. A method of manufacturing a layer structure, the method including:
   forming a first layer at least one of in and over a substrate, wherein the first layer protrudes from an exposed surface of the substrate and includes at least one of a greater porosity, a greater pore-size and a greater pore-density than the substrate; and
   planarizing the first layer, e.g. to less than the pore-size of the first layer.

2. The method of clause 1,
   forming a second layer over the first layer having at least one of a lower porosity, a lower pore-size and a lower pore-density than the first layer.

3. A method of manufacturing a layer structure, the method including:
   forming a first layer at least one of in and over a substrate;
   mechanically strengthen a surface of the layer structure by at least one of:
      compacting at least a surface region of the first layer, wherein at least one of a porosity, a pore-size and a pore-density of the surface region is reduced (e.g. freed of pores) by compacting; and
      replacing the surface region of the first layer by a (e.g. pore-free) second layer having at least one of a smaller porosity, a smaller pore-size and a smaller pore-density than the first layer.

4. A method of manufacturing a layer structure, the method including:
   forming a first layer at least one of in and over a substrate;
   planarizing the first layer to form a planarized surface of the first layer; and
   forming a second layer over the planarized surface having at least one of a smaller porosity, a smaller pore-size and a smaller pore-density porosity than the first layer.

5. A method of manufacturing an electronic device, the method including:
   forming at least one electronic component in a substrate;
   forming a contact pad in electrical contact with the at least one electronic component; wherein forming the contact pad includes:
      forming a first layer over the substrate;
      planarizing the first layer to form a planarized surface of the first layer; and
      forming a second layer over the planarized surface, wherein the second layer has at least one of a smaller porosity, a smaller pore-size and a smaller pore-density than the first layer.

6. The method of one of the clauses 2 to 5,
   wherein the second layer is formed by physical vapor deposition.

7. The method of one of the clauses 2 to 6,
   wherein the second layer is formed using a plasma, e.g. by sputtering.

8. The method of one of the clauses 2 to 7,
   wherein the first layer and the second layer include the same material (e.g. the same solid material), e.g. a metal (e.g. at least one of copper, silver and nickel) or a non-metal.

9. The method of one of the clauses 2 to 8,
   wherein the first layer and the second layer are formed from the same material (e.g. the same solid material), e.g. a metal (e.g. at least one of copper, silver and nickel) or a non-metal.

10. A method of manufacturing a layer structure, the method including:
    forming a first layer over a substrate;
    planarizing the first layer to form a planarized surface of the first layer; and
    forming a second layer over the planarized surface;
    wherein at least one of a porosity, a pore-size and a pore-density of the first layer is greater than a respective porosity, pore-size and pore-density of the substrate and greater than a respective porosity, pore-size and pore-density of the second layer;
    wherein the second layer is formed by physical vapor deposition; and
    wherein the first layer and the second layer include or are formed from the same material, e.g. the same solid material.

11. The method of one of the clauses 1 to 9,
    wherein at least one of a porosity, a pore-size and a pore-density of the first layer is greater than a respective porosity, pore-size and pore-density of the substrate and a respective porosity, pore-size and pore-density of the second layer.

12. The method of one of the clauses 1 to 11,
    wherein the first layer is formed from solid particles.

13. The method of one of the clauses 1 to 12,
    wherein the first layer is formed by solid particle deposition.

14. The method of one of the clauses 1 to 13,
    wherein the first layer is formed from solid particles disposed and sintered over the substrate.

15. A method of manufacturing a layer structure, the method including:
    disposing solid particles over a substrate and sintering the solid particles to form a first layer having at least one of a greater porosity, a greater pore-size and a greater pore-density than the substrate;
    planarizing the first layer to form a planarized surface of the first layer; and
    forming a second layer having at least one of a smaller porosity, a smaller pore-size and a smaller pore-density porosity than the first layer over the planarized surface;
    wherein the second layer is formed using a plasma, e.g. by sputtering.

16. The method of one of the clauses 1 to 15,
    wherein the first layer is a porous layer or includes at least one porous region.

17. The method of one of the clauses 2 to 16,
    wherein the second layer seals at least one pore of the first layer.

18. The method of one of the clauses 1 to 17,
    wherein at least one of the first layer and the second layer may include or be formed from an electrically conductive material.
19. The method of one of the clauses 1 to 18,
    wherein a hardness of the first layer is smaller than a hardness of at least one of the second layer and the substrate.
20. The method of one of the clauses 1 to 19,
    wherein a specific resistivity of the first layer is at least one of smaller than a specific resistivity of the second layer and greater than a specific resistivity of the substrate.
21. The method of one of the clauses 1 to 20,
    wherein a stress-temperature-gradient of the first layer is smaller than a stress-temperature-gradient of at least one of the second layer and the substrate.
22. The method of one of the clauses 1 to 21,
    wherein a density of the first layer is smaller than a density of at least one of the second layer and the substrate.
23. The method of one of the clauses 2 to 22,
    wherein the second layer is formed by at least one of the following (in other words, at least one deposition process selected from the following deposition processes): a physical vapor deposition; a printing deposition; and a chemical vapor deposition.
24. The method of clause 23,
    wherein the physical vapor deposition may include or be formed from sputtering or reactive sputtering.
25. The method of clause 23 or 24,
    wherein the chemical vapor deposition includes or is formed from plasma enhanced chemical vapor deposition.
26. The method of one of the clauses 1 to 25,
    wherein forming at least one of the first layer and the second layer includes using a fluid free deposition process.
27. The method of one of the clauses 1 to 26,
    wherein forming at least one of the first layer and the second layer includes or is formed from using an electrolyte free deposition process.
28. The method of one of the clauses 1 to 27,
    wherein at least one of the substrate and the second layer are substantially free of pores.
29. The method of one of the clauses 2 to 28,
    wherein a thickness of the second layer is at least one of: greater than half of a spatial pore-size of the first layer and smaller than twice the spatial pore-size of the first layer.
30. The method of one of the clauses 1 to 4 or 6 to 29, further including:
    forming a contact pad including at least one of the first layer and the second layer.
31. The method of one of the clauses 2 to 30,
    wherein the second layer and the first layer include or are formed from at least one of: the same metal, the same ceramic, the same glass, the same metal oxide, the same metal nitride, the same metal carbide, the same dielectric, the same semiconductor, and the same chemical composition.
32. The method of one of the clauses 2 to 31,
    wherein the second layer includes or is formed from at least one of the following materials: a metal, a ceramic, a glass, a metal oxide, a metal nitride, a metal carbide, a dielectric, and a semiconductor.
33. The method of one of the clauses 2 to 32,
    wherein the second layer is at least one of the following: a protection layer, a solderable layer, a bondable layer, and a pore-sealing layer.
34. The method of one of the clauses 1 to 33,
    wherein the first layer includes or is formed from at least one of the following materials: a metal, a ceramic, a glass, a metal oxide, a metal nitride, a metal carbide, a dielectric, and a semiconductor.
35. The method of one of the clauses 1 to 34,
    wherein the first layer includes or is formed from an open-pored surface at least one of before planarizing the first layer and after planarizing the first layer.
36. The method of one of the clauses 1 to 35,
    wherein planarizing the first layer includes or is formed from thinning the first layer.
37. The method of one of the clauses 1 to 36,
    wherein planarizing the first layer includes forming a gradient in at least one of the following pore-characteristics of the first layer:
    a pore-density;
    a pore-size; and
    a porosity.
38. The method of one of the clauses 1 to 37,
    wherein planarizing the first layer includes or is formed from reducing a pore characteristic of a surface of the first layer.
39. The method of one of the clauses 1 to 38,
    wherein forming the first layer includes or is formed from sintering a granular material.
40. The method of one of the clauses 1 to 39,
    wherein planarizing the first layer includes or is formed from at least one of the following: machining, mechanical polishing, electrochemical polishing, and chemical mechanical polishing.
41. The method of clause 14, 15, 39 or 40,
    wherein the first layer is planarized after having been sintered.
42. The method of one of the clauses 1 to 41,
    wherein planarizing the first layer includes or is formed from pressing the first layer.
43. The method of clause 14, 15, 39, 40 or 42,
    wherein the first layer is planarized at least one of before and during sintering.
44. The method of one of the clauses 1 to 43, further including:
    heating the first layer after planarization, e.g. before forming the second layer, to at least one of an evaporation temperature of an organic binder and a sintering temperature.
45. The method of one of the clauses 1 to 44, further including:
    forming a solder joint over at least one of the first layer and the second layer.
46. The method of one of the clauses 2 to 45, further including:
    electrically contacting the second layer.
47. The method of one of the clauses 1 to 46, further including:
    forming a bonding joint over at least one of the first layer and the second layer.
48. The method of one of the clauses 1 to 47,
    forming at least one of a barrier layer and an adhesion layer between the first layer and the substrate.
49. The method of one of the clauses 1 to 48,
    wherein planarizing the first layer reduces a roughness of the first layer.

50. The method of one of the clauses 1 to 49,
wherein planarizing the first layer is configured to form a roughness of the first layer less than a spatial pore-size of the first layer.
51. The method of one of the clauses 1 to 50,
wherein the first layer is formed by a printing process.
52. The method of one of the clauses 1 to 4 and 6 to 51, further including:
forming an electronic component in the substrate, wherein the electronic component is electrically connected with at least one of the first layer and the second layer.
53. The method of one of the clauses 1 to 52,
wherein planarizing first layer includes at least one of at least partially filling and at least partially sealing the pores of the first layer distant from at least one of the surface and the substrate with material of the first layer.
54. The method of one of the clauses 1 to 53,
wherein planarizing first layer includes forming a pore characteristic of the first layer proximate the substrate greater than distant from the substrate.
55. The method of one of the clauses 1 to 54,
wherein planarizing first layer includes forming a gradient in a pore characteristic directing towards the substrate.
56. The method of one of the clauses 2 to 55,
wherein planarizing first layer includes forming a gradient in a pore characteristic directing away from the second layer.
57. The method of one of the clauses 1 to 56,
wherein at least one of the following pore-characteristics of at least one of the substrate or the second layer is substantially zero:
a pore-density;
a pore-size; and
a porosity.
58. A layer structure, including:
a first layer formed at least one of in and over a substrate, wherein
the first layer
protrudes from the exposed surface of the substrate;
includes at least one of a greater porosity, a greater pore-size and a greater pore-density than the substrate; and
includes a planarized surface, e.g. having a roughness less than the pore-size of the first layer.
59. The method of clause 58,
a second layer formed over the planarized surface having at least one of a smaller porosity, a smaller pore-size and a smaller pore-density than the first layer.
60. A layer structure, including:
a first layer formed at least one of in and over a substrate;
a mechanically strengthened surface formed by at least one of:
an compacted surface region of the first layer, the surface region having at least one of a smaller porosity, a smaller pore-size and a smaller pore-density than the first layer in a region proximate the substrate; and
a second layer, wherein at least one of a porosity, a pore-size and a pore-density of the second layer is smaller than a respective porosity, pore-size and pore-density of the first layer.

61. A layer structure, including:
a first layer formed at least one of in and over a substrate;
wherein the first layer includes a planarized surface; and
a second layer formed over the planarized surface having at least one of a lower porosity, a lower pore-size and a lower pore-density than the first layer.
62. A layer structure in an electronic device, the electronic device including:
at least one electronic component formed in a substrate;
a contact pad formed in electrical contact with the at least one electronic component; wherein the contact pad includes:
a first layer formed over the substrate, the first layer including a planarized surface; and
a second layer formed over the planarized surface, the second layer having at least one of a lower porosity, a lower pore-size and a lower pore-density than the first layer.
63. The layer structure of one of the clauses 59 to 62,
wherein the first layer and the second layer include the same material (e.g. the same solid material), e.g. a metal (e.g. at least one of copper, silver and nickel) or a non-metal.
64. The layer structure of one of the clauses 59 to 63,
wherein the first layer and the second layer are formed from the same material (e.g. the same solid material), e.g. a metal (e.g. at least one of copper, silver and nickel) or a non-metal.
65. A layer structure, including:
a first layer formed over a substrate and including a planarized surface; and
a second layer formed over the planarized surface;
wherein at least one of a porosity, a pore-size, and a pore-density of the first layer is greater than a respective porosity, pore-size,
and pore-density of the substrate and greater than a respective porosity, pore-size, and pore-density of the second layer;
wherein the first layer and the second layer include or are formed from the same material (e.g. the same solid material).
66. The layer structure of one of the clauses 58 to 65,
wherein at least one of a porosity, a pore-size, and a pore-density of the first layer is greater than at least one of: a respective porosity, pore-size, and pore-density of the substrate and a respective porosity, pore-size, and pore-density of the second layer.
67. The layer structure of one of the clauses 58 to 66,
wherein the first layer is formed from solid particles.
68. The layer structure of one of the clauses 58 to 67,
wherein the first layer is formed from solid particles disposed and sintered over the substrate.
69. A layer structure, including:
a first layer formed over a substrate, the first layer including sintered particles and having at least one of a greater porosity, a greater pore-size, and a greater pore-density than the substrate;
wherein the first layer includes a planarized surface; and
a second layer having at least one of a smaller porosity, a smaller pore-size, and a smaller pore-density than the first layer and formed over the planarized surface;
wherein the second layer is formed using a plasma, e.g. by sputtering.

70. The layer structure of one of the clauses 58 to 69, wherein the first layer is a porous layer or includes at least one porous region.
71. The layer structure of one of the clauses 58 to 70, wherein the second layer seals at least one pore of the first layer.
72. The layer structure of one of the clauses 58 to 71, wherein a pore characteristic of the first layer is greater than a pore characteristic of at least one of the second layer and the substrate.
73. The layer structure of one of the clauses 58 to 72, wherein a hardness of the first layer is smaller than a hardness of at least one of the second layer and the substrate.
74. The layer structure of one of the clauses 58 to 73, wherein a specific resistivity of the first layer is at least one of smaller than a specific resistivity of the second layer and greater than a specific resistivity of the substrate.
75. The layer structure of one of the clauses 58 to 74, wherein a stress-temperature-gradient of the first layer is smaller than a stress-temperature-gradient of at least one of the second layer and the substrate.
76. The layer structure of one of the clauses 59 to 75, wherein a density of the first layer is smaller than a density of at least one of the second layer and the substrate.
77. The layer structure of one of the clauses 58 to 76, wherein at least one of the first layer and the second layer is free of a fluid.
78. The layer structure of one of the clauses 58 to 77, wherein at least one of the first layer and the second layer is free of an electrolyte.
79. The layer structure of one of the clauses 58 to 78, wherein at least one of the second layer and the substrate are substantially free of pores.
80. The layer structure of one of the clauses 59 to 79, wherein a thickness of the second layer is at least one of: greater than half of a spatial pore-size of the first layer and smaller than twice the spatial pore-size of the first layer.
81. The layer structure of one of the clauses 59 to 80, wherein the second layer and the first layer include or are formed from the same material (e.g. the same solid material).
82. The layer structure of one of the clauses 59 to 81, wherein the second layer and the first layer include or are formed from at least one of: the same metal, the same ceramic, the same glass, the same metal oxide, the same metal nitride, the same metal carbide, the same dielectric, the same semiconductor, and the same chemical composition.
83. The layer structure of one of the clauses 59 to 82, wherein the second layer includes or is formed from at least one of the following materials: a metal, a ceramic, a glass, a metal oxide, a metal nitride, a metal carbide, a dielectric, and a semiconductor.
84. The layer structure of one of the clauses 59 to 83, wherein the second layer is at least one of the following: a protection layer, a solderable layer, a bondable layer, and a pore-sealing layer.
85. The layer structure of one of the clauses 58 to 84, wherein the first layer includes or is formed from at least one of the following materials: a metal, a ceramic, a glass, a metal oxide, a metal nitride, a metal carbide, a dielectric, and a semiconductor.
86. The layer structure of one of the clauses 58 to 85, wherein the first layer includes an open-pored surface.
87. The layer structure of one of the clauses 58 to 86, wherein the first layer includes a gradient in at least one of the following pore-characteristics:
    a pore-density;
    a pore-size; and
    a porosity.
88. The layer structure of one of the clauses 58 to 87, wherein a pore characteristic of a surface region of the first layer is smaller than a pore characteristic of a region of the first layer proximate the substrate.
89. The layer structure of one of the clauses 58 to 88, wherein the first layer includes or is formed from a sintered granular material.
90. The layer structure of one of the clauses 58 to 89, wherein the first layer includes a planarized surface formed from at least one of the following: machining, mechanical polishing,
    electrochemical polishing, and chemical mechanical polishing.
91. The layer structure of one of the clauses 58 to 90, wherein the first layer includes a planarized surface formed from pressing the first layer.
92. The layer structure of one of the clauses 58 to 91, further including:
    a solder joint formed over at least one of the first layer and the second layer.
93. The layer structure of one of the clauses 59 to 92, further including:
    an electrically contact to the second layer.
94. The layer structure of one of the clauses 58 to 93, further including:
    a bonding joint formed over at least one of the first layer and the second layer.
95. The layer structure of one of the clauses 58 to 94, further including:
    at least one of a barrier layer and an adhesion layer formed between the first layer and the substrate.
96. The layer structure of one of the clauses 58 to 95, wherein a roughness of the planarized surface is less than a spatial pore-size of the first layer.
97. The layer structure of one of the clauses 58 to 96, wherein the first layer is formed from a printing process.
98. The layer structure of one of the clauses 58 to 61 and 63 to 97, further including:
    an electronic component formed in the substrate, wherein the electronic component is electrically connected with the first layer.
99. The layer structure of one of the clauses 58 to 98, wherein the first layer includes pores distant from the substrate which are at least one of at least partially filled and at least partially sealed with material of the first layer.
100. The layer structure of one of the clauses 58 to 99, wherein a pore characteristic of the first layer proximate the substrate is greater than distant from the substrate.
101. The layer structure of one of the clauses 58 to 100, wherein a gradient in a pore characteristic of the first layer directs towards the substrate.
102. The layer structure of one of the clauses 59 to 101, wherein a gradient in a pore characteristic of the first layer directs away from the second layer.

103. The layer structure of one of the clauses 58 to 102,
wherein at least one of the following pore-characteristics of at least one of the substrate and the second layer is substantially zero:
a pore-density;
a pore-size; and
a porosity.
104. The method of one of the clauses 1 to 57 or the layer structure of one of the clauses 58 to 102,
wherein the first layer includes or is formed from at least one of copper, silver and nickel.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of manufacturing a layer structure, the method comprising:
forming a first layer over a substrate;
planarizing the first layer to form a planarized surface of the first layer; and
forming a second layer over the planarized surface;
wherein a porosity of the first layer is greater than a porosity of the substrate and greater than a porosity of the second layer;
wherein the second layer is formed by physical vapor deposition; and
wherein the first layer and the second layer are formed from the same solid material.

2. The method of claim 1,
wherein the second layer seals at least one pore of the first layer.

3. The method of claim 1,
wherein the first layer protrudes from an exposed surface of the substrate.

4. The method of claim 1,
wherein at least one of the following pore-characteristics of at least one of the substrate or the second layer is substantially zero:
a pore-density;
a pore-size; and
a porosity.

5. The method of claim 1,
wherein the first layer is formed by depositing solid particles over the substrate.

6. The method of claim 5,
wherein forming the first layer comprises sintering the solid particles.

7. The method of claim 6,
wherein the first layer is planarized after having been sintered.

8. The method of claim 6,
wherein the first layer is planarized at least one of before and during sintering.

9. The method of claim 1,
wherein a stress-temperature-gradient of the first layer is smaller than a stress-temperature-gradient of at least one of the second layer and the substrate.

10. The method of claim 1,
wherein a density of the first layer is smaller than a density of at least one of the second layer and the substrate.

11. The method of claim 1,
wherein a thickness of the second layer is at least one of: greater than half of a spatial pore-size of the first layer and smaller than twice the spatial pore-size of the first layer.

12. The method of claim 1,
wherein the first layer comprises an open-pored surface at least one of before planarizing the first layer and after planarizing the first layer.

13. The method of claim 1,
wherein the first layer comprises at least one of copper, silver and nickel.

14. The method of claim 1,
wherein planarizing the first layer comprises forming a gradient in at least one of the following pore-characteristics of the first layer:
a pore-density;
a pore-size; and
a porosity.

15. The method of claim 1,
wherein planarizing the first layer comprises at least one of the following: machining, mechanical polishing, electrochemical polishing, and chemical mechanical polishing.

16. The method of claim 1, further comprising:
forming at least one of a solder joint and a bonding joint over the second layer for electrically contacting the second layer.

17. The method of claim 1,
wherein planarizing the first layer reduces a roughness of the first layer.

18. The method of claim 1,
wherein planarizing first layer comprises forming a pore characteristic of the first layer proximate the substrate greater than distant from the substrate.

19. The method of claim 1,
wherein planarizing the first layer comprises thinning the first layer.

20. A method of manufacturing a layer structure, the method comprising:
disposing solid particles over a substrate and sintering the solid particles to form a first layer having a greater porosity than the substrate;
planarizing the first layer to form a planarized surface of the first layer; and
forming a second layer having a lower porosity than the first layer over the planarized surface;
wherein the second layer is formed by sputtering.

* * * * *